(12) United States Patent
Ahn et al.

(10) Patent No.: US 10,096,792 B2
(45) Date of Patent: Oct. 9, 2018

(54) DISPLAY DEVICE HAVING WINDOW MEMBER AND METHOD OF MANUFACTURING WINDOW MEMBER

(71) Applicant: Samsung Display Co., Ltd., Yongin-Si, Gyeonggi-Do (KR)

(72) Inventors: Hungkun Ahn, Seongnam-si (KR); Sungguk An, Suwon-si (KR); Jongsung You, Suwon-si (KR); Sookkyung You, Seoul (KR); Kitae Kim, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 39 days.

(21) Appl. No.: 15/160,986

(22) Filed: May 20, 2016

(65) Prior Publication Data
US 2017/0062756 A1    Mar. 2, 2017

(30) Foreign Application Priority Data

Aug. 24, 2015 (KR) .......................... 10-2015-0119077

(51) Int. Cl.
*H01L 51/52* (2006.01)
*B32B 7/02* (2006.01)
(Continued)

(52) U.S. Cl.
CPC ...... *H01L 51/5237* (2013.01); *B29C 45/0053* (2013.01); *B29C 45/14* (2013.01);
(Continued)

(58) Field of Classification Search
CPC .............. H01L 51/5237; H01L 27/323; H01L 51/0035; H01L 51/004; H01L 51/5253;
(Continued)

(56) References Cited

U.S. PATENT DOCUMENTS

| 2013/0002583 A1* | 1/2013 | Jin ........................ G06F 1/1637 345/173 |
| 2013/0177748 A1* | 7/2013 | Hirai ...................... B32B 27/08 428/203 |

(Continued)

FOREIGN PATENT DOCUMENTS

| JP | 2013-208896 A | 10/2013 |
| KR | 10-0751831 B1 | 8/2007 |

(Continued)

OTHER PUBLICATIONS

EPO Extended Search Report dated Jan. 4, 2017, for corresponding European Patent Application No. 16180505.6 (7 pages).

*Primary Examiner* — Adam S Bowen
(74) *Attorney, Agent, or Firm* — Lewis Roca Rothgerber Christie LLP

(57) ABSTRACT

A display device includes a window member and a display module coupled to the window member. The window member includes a first resin layer and a second resin layer. The first resin layer is on the display module and has a first elongation, a first thickness, and a first hardness. The second resin layer is on the display module and the first resin layer and has a second elongation smaller than the first elongation, a second thickness greater than the first thickness, and a second hardness greater than the first hardness.

16 Claims, 19 Drawing Sheets

(51) Int. Cl.
  *B32B 7/12*    (2006.01)
  *B32B 27/08*   (2006.01)
  *B32B 27/30*   (2006.01)
  *B32B 27/36*   (2006.01)
  *B32B 1/00*    (2006.01)
  *B29C 45/00*   (2006.01)
  *B29C 45/14*   (2006.01)
  *H01L 27/32*   (2006.01)
  *H01L 51/00*   (2006.01)
  *H01L 51/56*   (2006.01)
  *G02F 1/1333*  (2006.01)
  *B29K 33/00*   (2006.01)
  *B29K 105/20*  (2006.01)
  *B29K 667/00*  (2006.01)
  *B29K 669/00*  (2006.01)
  *B29L 31/34*   (2006.01)

(52) U.S. Cl.
  CPC .............. *B32B 1/00* (2013.01); *B32B 7/02* (2013.01); *B32B 7/12* (2013.01); *B32B 27/08* (2013.01); *B32B 27/308* (2013.01); *B32B 27/36* (2013.01); *B32B 27/365* (2013.01); *H01L 27/323* (2013.01); *H01L 51/004* (2013.01); *H01L 51/0035* (2013.01); *H01L 51/5253* (2013.01); *H01L 51/56* (2013.01); *B29C 2045/0079* (2013.01); *B29C 2045/14868* (2013.01); *B29K 2033/12* (2013.01); *B29K 2105/20* (2013.01); *B29K 2667/003* (2013.01); *B29K 2669/00* (2013.01); *B29K 2995/007* (2013.01); *B29K 2995/0077* (2013.01); *B29L 2031/3475* (2013.01); *B32B 2255/10* (2013.01); *B32B 2307/50* (2013.01); *B32B 2307/536* (2013.01); *B32B 2307/558* (2013.01); *B32B 2307/584* (2013.01); *B32B 2457/20* (2013.01); *B32B 2457/208* (2013.01); *B32B 2571/00* (2013.01); *G02F 2001/133331* (2013.01); *H01L 2251/5338* (2013.01); *H01L 2251/558* (2013.01)

(58) Field of Classification Search
  CPC ..... H01L 51/56; B29C 45/0053; B29C 45/14; B32B 27/365; B32B 27/308; B32B 27/08; B32B 27/36; B32B 7/12; B32B 7/02; B32B 1/00
  USPC .......................................................... 257/40
  See application file for complete search history.

(56) References Cited

U.S. PATENT DOCUMENTS

| | | |
|---|---|---|
| 2014/0147651 A1 | 5/2014 | Hitomi et al. |
| 2014/0267952 A1 | 9/2014 | Sirois |
| 2014/0295157 A1 | 10/2014 | Hirai et al. |
| 2014/0376237 A1 | 12/2014 | Hwang et al. |

FOREIGN PATENT DOCUMENTS

| | | |
|---|---|---|
| KR | 10-2014-0142562 A | 12/2014 |
| KR | 10-2014-0142633 A | 12/2014 |
| KR | 10-2015-0000075 A | 1/2015 |
| KR | 10-2015-0000361 A | 1/2015 |

* cited by examiner

DISPLAY DEVICE HAVING WINDOW MEMBER AND METHOD OF MANUFACTURING WINDOW MEMBER

CROSS-REFERENCE TO RELATED APPLICATION

This U.S. non-provisional patent application claims priority and benefit under 35 U.S.C. § 119 of Korean Patent Application No. 10-2015-0119077, filed on Aug. 24, 2015, the entire contents of which are hereby incorporated by reference.

BACKGROUND

1. Field

Aspects of embodiments of the present invention relate to a display device having a window member and a method of manufacturing the same. More particularly, the aspects of embodiments of the present invention relate to a display device having a window member having a multi-layer structure and a method of manufacturing the window member.

2. Related Art

Electronic devices, such as smart phones, digital cameras, notebook computers, navigation systems, smart television sets, etc., may include a display device, a communication module, a camera module, a control circuit module, and a protective cover. The display device includes a display module and a window member. The display device may be coupled to the protective cover.

The window member and the protective cover define an outer surface of the electronic device. The protective cover protects the communication module, the camera module, and the control circuit module from external impact. The window member provides a touch surface.

SUMMARY

Aspects of embodiments of the present invention relate to a display device including a window member having improved impact resistance and improved hardness.

Aspects of embodiments of the present invention relate to a method of manufacturing the window member to reduce a production cost and a defect rate.

According to one embodiment of the present invention, a display device includes a window member and a display module coupled to the window member. The window member includes a first resin layer on the display module, the first resin layer having a first elongation, a first thickness, and a first hardness and a second resin layer on the display module and the first resin layer, the second resin layer having a second elongation smaller than the first elongation, a second thickness greater than the first thickness, and a second hardness greater than the first hardness.

The first thickness may be in a range from about 150 micrometers to about 250 micrometers and the second thickness may be in a range from about 300 micrometers to about 700 micrometers.

The first hardness may correspond to a hardness of a pencil hardness of about 2B to about F and the second hardness may correspond to a hardness of a pencil hardness of about 3H to about 5H.

The first elongation may be in a range from about 20% to about 100% and the second elongation may be in a range from about 1% to about 10%.

The first resin layer may include polycarbonate or polyethylene terephthalate and the second resin layer may include an acrylic-based resin.

The acrylic-based resin may include polymethyl methacrylate.

The window member may further include a bezel layer between the first resin layer and the second resin layer and partially overlapping with the first resin layer and the second resin layer.

The first resin layer may include a first front surface and a first rear surface closer to the display module than the first front surface and the second resin layer may include a second front surface and a second rear surface closer to the display module than the second front surface. The window member may further include a hard coating layer on at least one surface of the first rear surface and the second front surface. The hard coating layer may have a thickness of about 5 micrometers to about 35 micrometers.

The window member may include a flat surface area and a first side surface area bent from a first side of the flat surface area.

The window member may further include a second side surface area bent from a second side of the flat surface area, which faces the first side of the flat surface area.

The window member may further include an optical clear adhesive layer between the first resin layer and the second resin layer.

The first resin layer may include a first front surface and a first rear surface closer to the display module than the first front surface and the second resin layer may include a second front surface and a second rear surface disposed closer to the display module than the second front surface. The window member may further include a bezel layer disposed on the first front surface and partially overlapped with the first and second resin layers.

The optical clear adhesive layer may have a thickness of about 25 micrometers to about 50 micrometers.

The display module may include a flexible display panel configured to generate an image and a touch panel coupled to the flexible display panel. The flexible display panel may be an organic light emitting diode display panel.

According to one embodiment of the present invention, a method of manufacturing a window member includes depositing a base film including a first resin material on a bottom surface of a lower mold including a flat surface area and a side surface area, disposing an upper mold on the lower mold to define a forming space, injecting a second resin material different from the first resin material into the forming space, and cooling the second resin material to form an injection layer, the injection layer having a thickness greater than a thickness of the base film, an elongation smaller than an elongation of the base film, and a hardness greater than a hardness of the base film, on the base film.

The upper mold may include a forming surface to define the forming space and the forming surface may include a flat surface area corresponding to the flat surface area of the bottom surface of the lower mold and a side surface area corresponding to the side surface area of the bottom surface of the lower mold.

The method may further include forming a bezel layer on one surface of the base film to allow the bezel layer to partially overlap with the base film before the disposing of the base film.

The method may further include forming a hard coating layer on at least one surface of a surface of the injection layer and a surface of the base film, which are exposed to an exterior after the forming of the injection layer.

The first resin material may include polycarbonate or polyethylene terephthalate and the second resin material includes an acrylic-based resin. The acrylic-based resin may include polymethyl methacrylate. The side surface area of the bottom surface may provide a curved surface.

According to one embodiment of the present invention, a method of manufacturing a window member includes providing a base film including a first resin material, providing a rigid member including a flat surface area and a side surface area bent from the flat surface and including a second resin material different from the first resin material, and disposing an optical clear adhesive member between the base film and the rigid member to attach the base film to the rigid member.

The rigid member may have a thickness greater than a thickness of the base film, an elongation smaller than an elongation of the base film, and a hardness greater than a hardness of the base film.

The method may further include forming a bezel layer on one surface of the base film, the bezel layer partially overlapping the base film.

The method may further include forming a hard coating layer on at least one of a surface of the rigid member and a surface of the base film, which are exposed to an exterior, after the attaching of the base film to the rigid member.

The first resin material may include polycarbonate or polyethylene terephthalate and the second resin material may include an acrylic-based resin. The acrylic-based resin includes polymethyl methacrylate.

The rigid member may be formed by one of an injection molding method, an extrusion molding method, and a press molding method.

According to the above, because the second resin layer has a hardness greater than that of the first resin layer, defects, e.g., scratch marks, may be mitigated or prevented from occurring on the window member even though an external object, such as an input member, a surrounding object, etc., makes contact with the input surface and the touch surface. In addition, because the second resin layer has the thickness greater than that of the first resin layer, the surface hardness of the window member increases. The first resin layer may endure the tensile stress generated when the force from an external impact is applied to the first resin layer, and thus the window member may be protected or prevented from being broken due to the external impact.

According to the manufacturing method, the three-dimensional window member having the high hardness may be manufactured. Because the three-dimensional shape of the window member is formed without applying stress to the base member, the window member may be protected or prevented from being twisted. Further, according to the manufacturing method, a manufacturing process of the window member is simplified, a defect rate of the window member is decreased, and a production cost of the window member is reduced.

BRIEF DESCRIPTION OF THE DRAWINGS

Aspects of embodiments of the present invention will become readily apparent by reference to the following detailed description when considered in conjunction with the accompanying drawings wherein.

DETAILED DESCRIPTION

Figure 1:
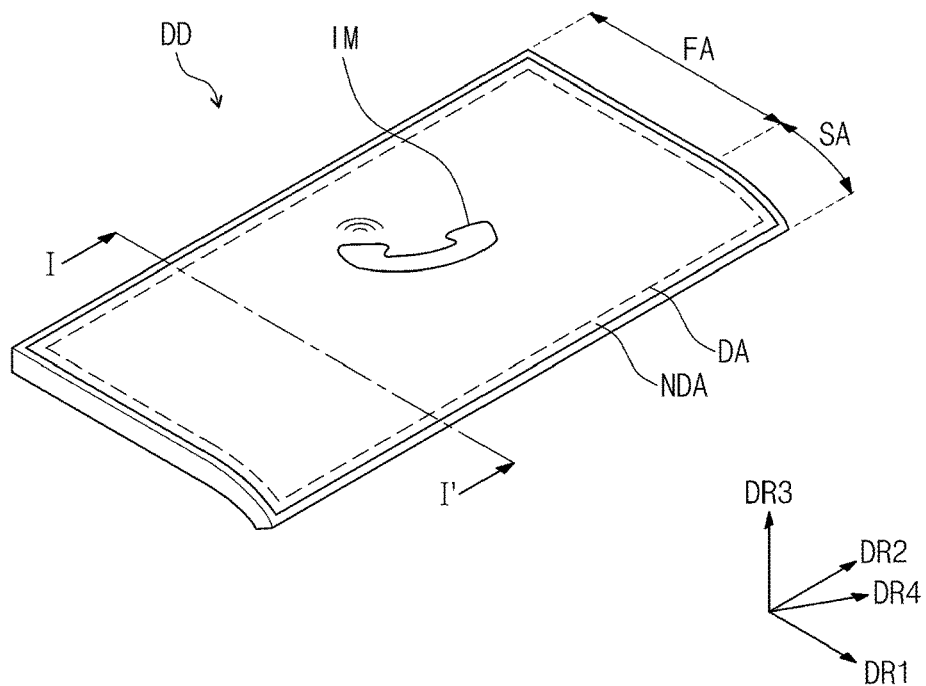
FIG. 1 is a perspective view showing a display device according to an example embodiment of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections are not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, are to be interpreted as having a meaning that is consistent with their meaning in the context of the relevant art and will not be interpreted in an idealized or overly formal sense unless expressly so defined herein.

Hereinafter, aspects of embodiments of the present invention will be explained in more detail below with reference to the accompanying drawings.

Figure 2:
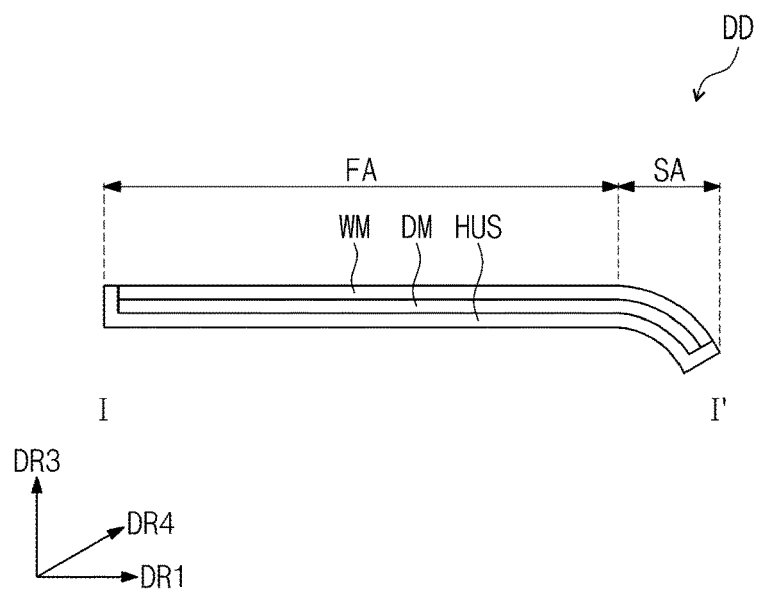
FIG. 2 is a cross-sectional view taken along a line I-I' to show the display device shown in FIG. 1.
Figure 3:
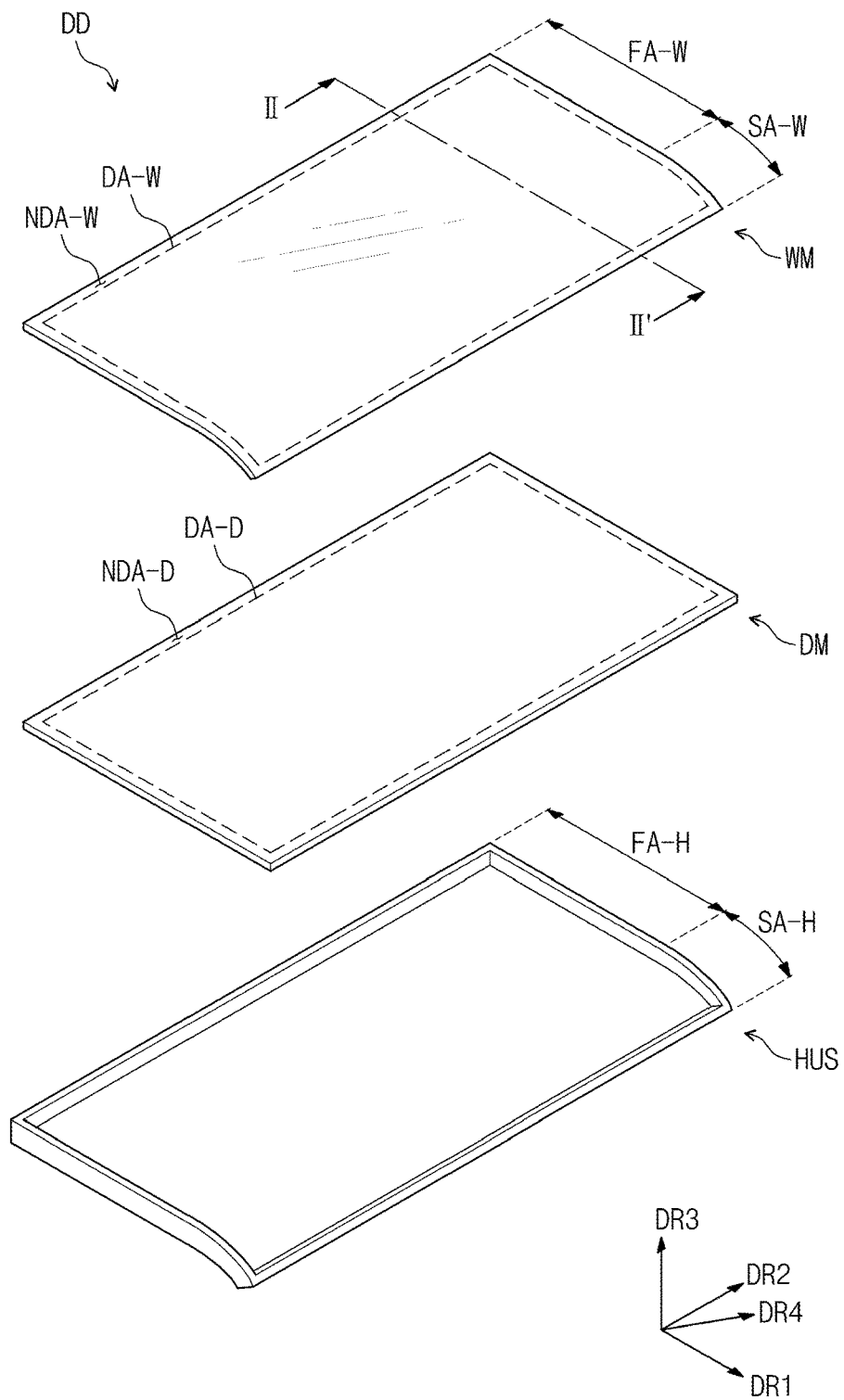
FIG. 3 is an exploded perspective view showing the display device shown in FIG. 1.

FIG. 1 is a perspective view showing a display device DD according to an example embodiment of the present invention, FIG. 2 is a cross-sectional view taken along a line I-I' to show the display device DD shown in FIG. 1, and FIG. 3 is an exploded perspective view showing the display device DD shown in FIG. 1.

The display device DD shown in FIG. 1 may be used with or applied to a smart phone, but embodiments of the present invention limited thereto or thereby. For example, the display device DD according to the present example embodiment may be applied to other electronic devices, e.g., a television set, a personal computer, a notebook computer, a car navigation unit, a game unit, sound electronics, a smart watch, a camera, etc.

Referring to FIG. 1, the display device DD includes a display area DA (or referred to as a display part) in which an image is displayed and a non-display area NDA (or referred to as a non-display part) in which the image is not displayed. In the present example embodiment, the terms "display area DA" and "non-display area NDA" used herein indicate areas (or referred to as parts), which are distinguished from each other whether the areas display the image or not, to define the display device DD. In FIG. 1, the non-display area NDA surrounds the display area DA, but embodiments of the present invention are not limited thereto or thereby. For example, the non-display area NDA may be disposed adjacent to one side portion of the display area or may be omitted (e.g., a display device DD may lack a non-display area NDA on one or more sides, such that the display area DA extends to the edge of the display device DD).

The display device DD includes a flat surface area FA (or referred to as a flat surface part) in which a main image is displayed to a front surface and a side surface area SA (or referred to as a side surface part) in which a sub-image is displayed to a side surface. In the present example embodiment, the terms "flat surface area FA" and "side surface area SA" used herein indicate areas (or referred to as parts), which are distinguished from each other on the basis of shapes thereof, to define the display device DD.

In the present example embodiment, the display device DD includes one side surface area SA bent from one side portion of the flat surface area FA. As the main image, a receiver IM shown on a background image is shown and the background image is shown as the sub-image. Although not shown separately, the sub-image may include icons that provide information (e.g., predetermined information). As another way, the display device DD according to the present example embodiment may include only the flat surface area FA.

The flat surface area FA is substantially parallel to a surface defined by a first direction DR1 and a second direction DR2. A normal line direction of the flat surface area FA indicates a third direction DR3. The third direction DR3 corresponds to a reference direction to distinguish a front surface from a rear surface of each member. The side surface area SA bent from the flat surface area FA displays the sub-image to a fourth direction DR4 crossing the first, second, and third directions DR1, DR2, and DR3. However, the first, second, third, and fourth directions DR1, DR2, DR3, and DR4 are relative to each other, and thus the first to fourth directions DR1, DR2, DR3, and DR4 may be changed to any other directions.

Referring to FIG. 2, the display device DD includes a window member WM, a display module DM, and a housing HUS. The window member WM provides a front surface of the display device DD. The window member WM provides an input surface/a touch surface/a display surface for the user's input. The display module DM generates or displays an image. The display module DM and the window member WM are disposed on the housing HUS. Although not shown separately, the window member WM may be attached to the display module DM by an optical clear adhesive and the display module DM may be attached to the housing HUS by the optical clear adhesive.

Referring to FIG. 3, the window member WM includes a display area DA-W and a non-display area NDA-W, which respectively correspond to the display area DA and the non-display area NDA of the display device DD. The window member WM includes a flat surface area FA-W and a side surface area SA-W, which respectively correspond to the flat surface area FA and the side surface area SA of the display device DD.

As shown in FIG. 3, the display module DM may be maintained in a flat state before being coupled to the window member WM. In the embodiment shown in FIG. 3, the display module DM has a flexible property. When the display module DM is coupled to the window member WM, the display module DM is divided into (or is bent or curved to have) a flat surface area and a side surface area. The display module DM includes a display area DA-D and a non-display area NDA-D, which respectively correspond to the display area DA and the non-display area NDA of the display device DD. Pixels are disposed or arranged in the display area DA-D and not disposed or arranged in the non-display area NDA-D. In FIG. 3, the non-display area DA-D surrounds the display area DA-D, but the non-display area NDA-D may be disposed to correspond to only one side portion of the display area DA-D according to embodiment.

As shown in FIG. 3, the housing HUS includes a flat surface area FA-H and a side surface area SA-H, which respectively correspond to the flat surface area FA and the side surface area SA of the display device DD. In the present example embodiment, the housing HUS may have a generally flat shape. In the embodiment shown in FIG. 3, the housing HUS is integrally formed as a single unit, but in other embodiments the housing HUS may be configured to include a plurality of brackets.

Figure 4A:
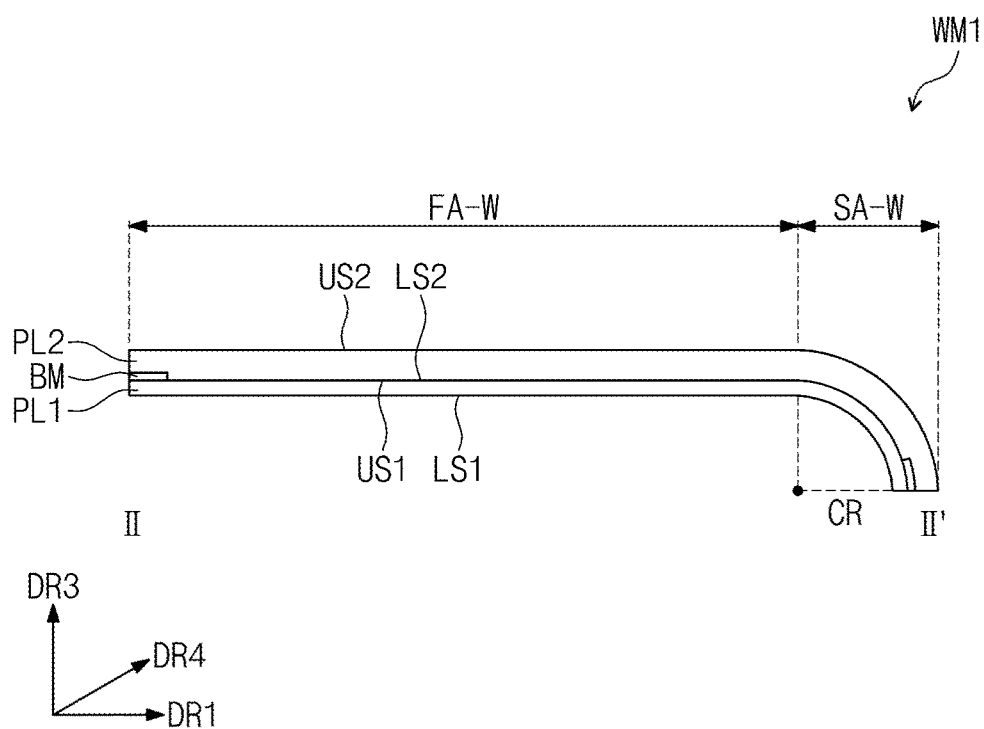
FIG. 4A is a cross-sectional view showing a window member according to an example embodiment of the present invention.
Figure 4B:
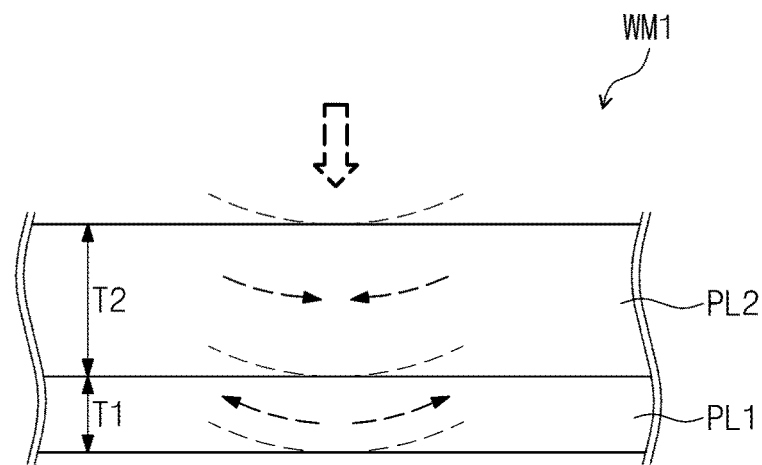
FIG. 4B is a cross-sectional view showing the window member shown in FIG. 4A, which is applied with force due to an external impact.

FIG. 4A is a cross-sectional view taken along a line II-II' shown in FIG. 3 to show a window member WM1 according to an example embodiment of the present invention and FIG. 4B is a cross-sectional view showing the window member WM1 shown in FIG. 4A, which is applied with force due to an external impact. Hereinafter, the window member WM1 will be described with reference to FIGS. 4A and 4B.

Referring to FIG. 4A, the window member WM1 includes a flat surface area FA-W and a side surface area SA-W bent from one side portion of the flat surface area FA-W. In the embodiment of FIG. 4A, the side surface area SA-W has a shape curved at a uniform radius of curvature CR. The side surface area SA-W provides an input surface/a touch surface/a display surface, which are generally curved surfaces. The side surface area SA-W according to embodiments of the present invention is not limited to a specific shape as long as the side surface area SA-W is bent from (e.g., not coplanar with) the flat surface area FA-W.

In the embodiment shown in FIGS. 4A and 4B, window member WM1 includes a first resin layer PL1 and a second resin layer PL2. The second resin layer PL2 is disposed on and coupled to the first resin layer PL1. The first resin layer PL1 has a first elongation (or first strain), a first thickness T1, and a first hardness. The second resin layer PL2 has a second elongation (or second strain) smaller than the first elongation, a second thickness T2 greater than the first thickness T1, and a second hardness greater than the first hardness.

Each of the first and second resin layers PL1 and PL2 includes a rear surface and a front surface. The rear surface LS1 (hereinafter, referred to as a first rear surface) of the first resin layer PL1 is disposed closer to (or nearer) the display module DM (refer to FIG. 2) than the front surface US1 (hereinafter, referred to as a first front surface) of the first resin layer PL1, and the rear surface LS2 (hereinafter, referred to as a second rear surface) of the second resin layer PL2 is disposed closer to (or nearer) the display module DM than the front surface US2 (hereinafter, referred to as a second front surface) of the second resin layer PL2. In the present example embodiment, the first front surface US1 makes contact with the second rear surface LS2. In the present example embodiment, no adhesive layer is disposed between the first and second resin layers PL1 and PL2. This is because the window member WM is manufactured by an in-mold injection molding method as described later.

Referring to FIG. 4B, when the impact force is sectionally applied to the window member WM1, a portion applied with the impact force is instantaneously deformed. In the case where the impact force is applied to the front surface US2 (refer to FIG. 4A) of the second resin layer PL2 that provides the input surface and the touch surface, a compressive stress is applied to the second resin layer PL2 and a tensile stress is applied to the first resin layer PL1. The first resin layer PL1, which has the elongation relatively greater than that of the second resin layer PL2, has a durability higher than that of the second resin layer PL2 against the tensile stress. The second resin layer PL2, which has the elongation relatively smaller than that of the first resin layer PL1, has a durability higher than that of the first resin layer PL1 against the compressive stress. Accordingly, the window member WM1 according to the present example embodiment has a high impact resistance.

Because the second resin layer PL2 has the hardness greater than that of the first resin layer PL1, defects, e.g., scratch marks, may be mitigated or prevented from occurring on the input surface/the touch surface even though an external object, such as an input member, a surrounding object, etc., makes contact with the input surface and the touch surface. In addition, because the second resin layer PL2 having the hardness greater than that of the first resin layer PL1 has the thickness greater than that of the first resin layer PL1, the overall hardness of the window member WM1 increases.

The first thickness T1 is in a range from about 150 micrometers ($\mu$m) to about 250 micrometers and the second thickness T2 is in a range from about 300 micrometers to about 700 micrometers, and in one embodiment is in a range from about 330 micrometers to about 500 micrometers. The first hardness corresponds to a hardness of a pencil hardness of about 2B to about F and the second hardness corresponds to a hardness of a pencil hardness of about 3H to about 5H. The first elongation is in a range from about 20% to about 100% and the second elongation is in a range from about 1% to about 10%. The thickness, the hardness, and the elongation will be described in more detail below.

The first resin layer PL1 may include a resin material (hereinafter, referred to as a first resin material) having high elongation, e.g., polycarbonate. The first resin layer PL1 may include polyethylene teraphthalate (PET). The second resin layer PL2 may include a resin material (hereinafter, referred to as a second resin material) having high hardness, e.g., acryl-based resin. In particular, the second resin layer PL2 may include polymethylmethacrylate (PMMA).

The window member WM1 includes a bezel layer BM. The bezel layer BM is disposed between the first and second resin layers PL1 and PL2 and partially overlapped with the first and second resin layers PL1 and PL2. The bezel layer BM defines the non-display area NDA-W of the window member WM described with reference to FIG. 3. The bezel layer BM may include dyes or pigments to display a color (e.g., a predetermined color). The bezel layer BM has a multi-layer structure and may include a pattern to provide information (e.g., predetermined information). For instance, the bezel layer BM may include a hairline pattern to provide manufacturer's brand information.

According to the present example embodiment, because the bezel layer BM is protected by the first and second resin layers PL1 and PL2, the bezel layer BM may be protected or prevented from being damaged even though a functional layer is additionally formed on the outer surface of the window member WM1. However, the bezel layer BM may be omitted or disposed on other layers according to various other embodiments of the present invention.

Figure 5A:
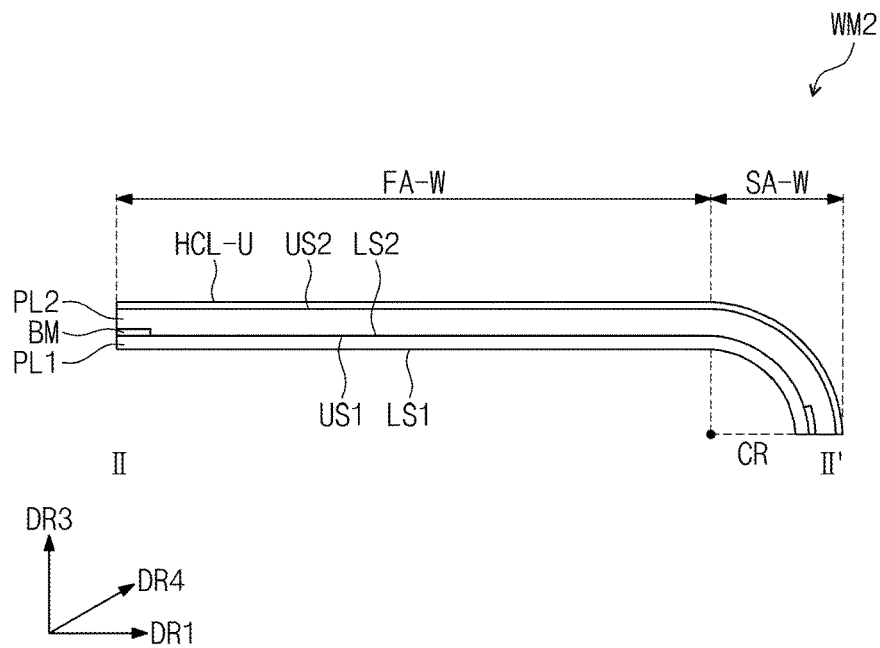
FIGS. 5A and 5B are cross-sectional views showing a window member according to example embodiments of the present invention.
Figure 5B:
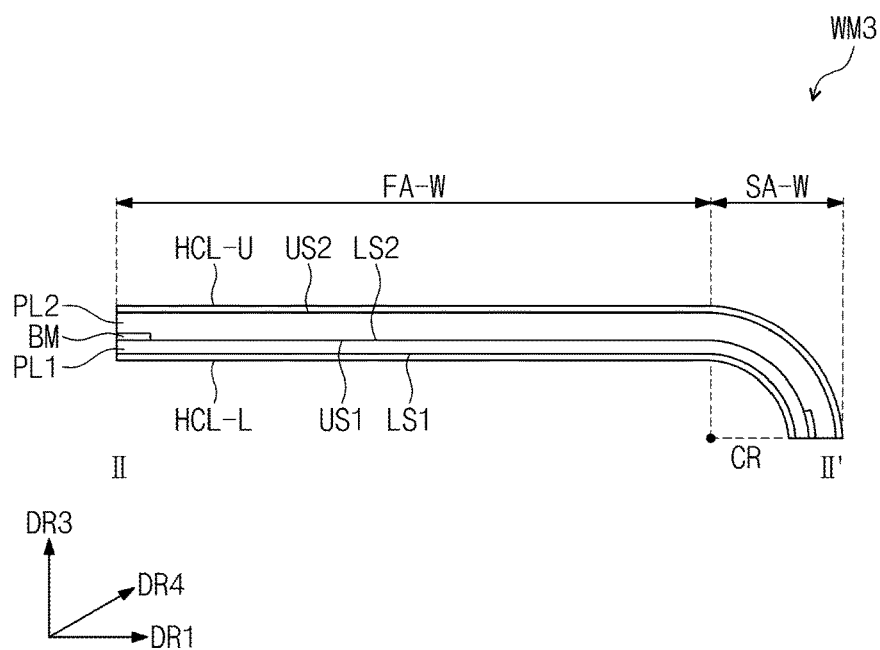

FIGS. 5A and 5B are cross-sectional views showing window members WM2 and WM3 according to an example embodiment of the present invention. Hereinafter, the window members WM2 and WM3 will be described in more detail with reference to FIGS. 5A and 5B. In FIGS. 5A and 5B, the same reference numerals denote the same elements in FIGS. 1, 2, 3, 4A, and 4B, and thus detailed descriptions of the same elements will be omitted.

According to the present example embodiment, the window member may further include a functional layer disposed on at least one surface of a first rear surface LS1, a first front surface US1, a second rear surface LS2, and a second front surface US2. The functional layer may include at least one of an anti-finger coating layer, an anti-reflection coating layer, an anti-glare coating layer, and a hard coating layer.

Referring to FIG. 5A, the window member WM2 includes a hard coating layer HCL-U (hereinafter, referred to as a first hard coating layer) disposed on the second front surface US2. The first hard coating layer HCL-U improves the hardness of the window member WM2 including the second resin layer PL2.

Referring to FIG. 5B, the window member WM3 includes a hard coating layer HCL-L (hereinafter, referred to as a second hard coating layer) disposed on the first rear surface LS1. The second hard coating layer HCL-L improves the hardness of the window member WM3 and is disposed to be symmetrical with the first hard coating layer HCL-U to reduce a curl of the window member WM3.

Figure 6A:
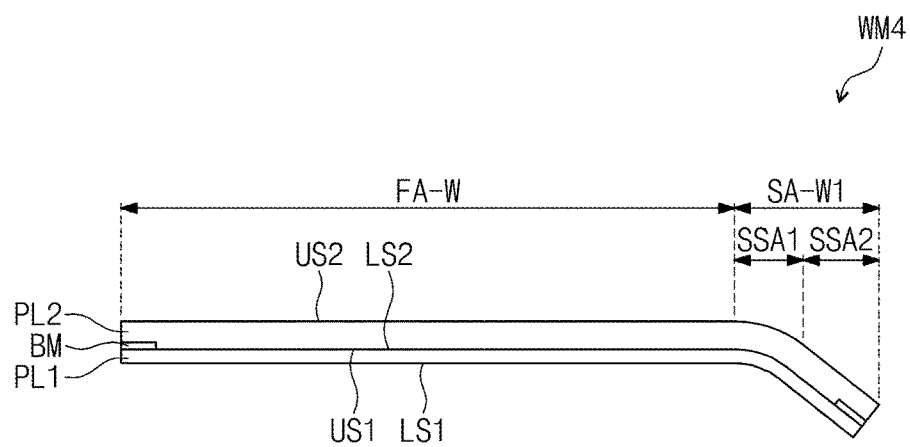
FIGS. 6A and 6B are cross-sectional views showing a window member according to example embodiments of the present invention.
Figure 6B:
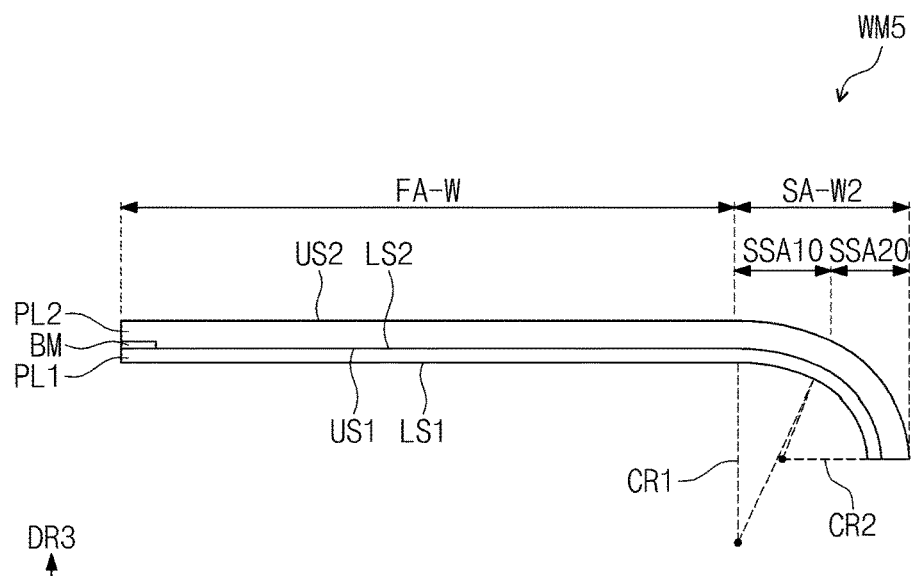

FIGS. 6A and 6B are cross-sectional views showing window members WM4 and WM5 according to an example embodiment of the present invention. Hereinafter, the window members WM4 and WM5 will be described in more detail with reference to FIGS. 6A and 6B. In FIGS. 6A and 6B, the same reference numerals denote the same elements in FIGS. 1, 2, 3, 4A, 4B, 5A, and 5B, and thus detailed descriptions of the same elements will be omitted.

Referring to FIG. 6A, a side surface area SA-W1 of the window member WM4 includes a round area SSA1 (or referred to as a round part or rounded part) bent from the flat surface area FA and a sub-flat surface area SSA2 (or referred to as a sub-flat surface part) extending from the round area SSA1. In FIG. 6A, the sub-flat surface area SSA2 is inclined (e.g., at a non-zero and non-perpendicular angle) to the flat surface area FA, but the sub-flat surface area SSA2 may be substantially vertical (e.g., perpendicular) to the flat surface area FA. For example, the flat surface area FA may be substantially parallel to the first direction DR1 and the sub-flat surface area SSA2 may be substantially parallel to the third direction DR3.

Referring to FIG. 6B, the window member WM5 includes a first round area SSA10 (or referred to as a first round part or a first rounded part) bent from the flat surface area FA and a second round area SSA20 extending from the first round area SSA10 (or referred to as a second round part or a second rounded part). The second round area SSA20 is curved at a radius of curvature CR2 different from a radius of curvature CR1 of the first round area SSA10.

Hereinafter, the window member will be described in more detail with reference to Table 1. Comparison examples and experimental examples shown in Table 1 have the same structure as that of the window member WM3 described with reference to FIG. 5B. An impact resistance strength indicates a height at which the window member starts to be broken when a metal ball with a weight of about 130 grams is dropped on the window member WM3.

TABLE 1

|  | Material/ thickness (μm)/ pencil hardness of first resin layer | Material/ thickness (μm)/ pencil hardness of second resin layer | Thickness (μm) of first and second hard coating layer | Total thickness (μm) | Front surface pencil hardness | Impact resistance strength |
| --- | --- | --- | --- | --- | --- | --- |
| Comparison example 1 | PC/100/B | PMMA/ 330/4H | 10 ± 4 | 450 | 7-9H | 10 |
| Comparison example 2 | PC/100/B | PMMA/ 430/4H | 10 ± 4 | 550 | 7-9H | 15 |
| Experimental example 1 | PC/150/B | PMMA/ 330/4H | 10 ± 4 | 500 | 7-9H | 20 |
| Experimental example 2 | PC/150/B | PMMA/ 430/4H | 10 ± 4 | 600 | 7-9H | 25 |
| Experimental example 3 | PC/200/B | PMMA/ 330/4H | 10 ± 4 | 550 | 7-9H | 25 |
| Experimental example 4 | PC/200/B | PMMA/ 430/4H | 10 ± 4 | 650 | 7-9H | 30 |
| Experimental example 5 | PC/250/B | PMMA/ 330/4H | 10 ± 4 | 600 | 7-9H | 30 |
| Experimental example 6 | PC/250/B | PMMA/ 430/4H | 10 ± 4 | 700 | 7-9H | 35 |

According to the comparison examples 1 and 2, because the thickness of the first resin layer is relatively thin, the impact resistance strength of the comparison examples 1 and 2 is smaller than that of the experimental examples 1, 2, 3, 4, 5, and 6. This is because the first resin layer of the comparison examples 1 and 2 is not enough to endure the tensile stress occurring when the external impact is applied to the first resin layer. Therefore, in one embodiment, the first resin layer has a thickness of about 150 micrometers or more, but, in some embodiments, the thickness of the first resin layer is smaller than about 250 micrometers so that the total thickness of the window member is not excessively thick.

According to the present example embodiment, the second resin layer has a thickness of about 300 micrometers or more to improve reliability of the injection molding process. In addition, in one embodiment of the present invention, the thickness of the second resin layer is smaller than about 700 micrometers so that the thickness of the window member is not excessively thick. In one embodiment, the second resin layer has the thickness of about 330 micrometers to about 500 micrometers to protect or prevent a three-dimensional shape from being deformed and so that the thickness of the window member is not excessively thick.

Each of the first and second hard coating layers has a thickness of about 5 micrometers to about 35 micrometers. In the case where the thickness of the first and second hard coating layers is smaller than about 5 micrometers, the improvement of the hardness is insufficient, and when the thickness of the first and second hard coating layers is greater than about 35 micrometers, the impact resistance of the first and second hard coating layers decreases, and thus the first and second hard coating layers are easily broken.

FIGS. 7A, 7B, 7C, 7D, and 7E are cross-sectional views showing a method of manufacturing a window member according to an example embodiment of the present invention. In the present example embodiment, the manufacturing method of the window member WM1 shown in FIG. 4A will be described in more detail.

Figure 7A:
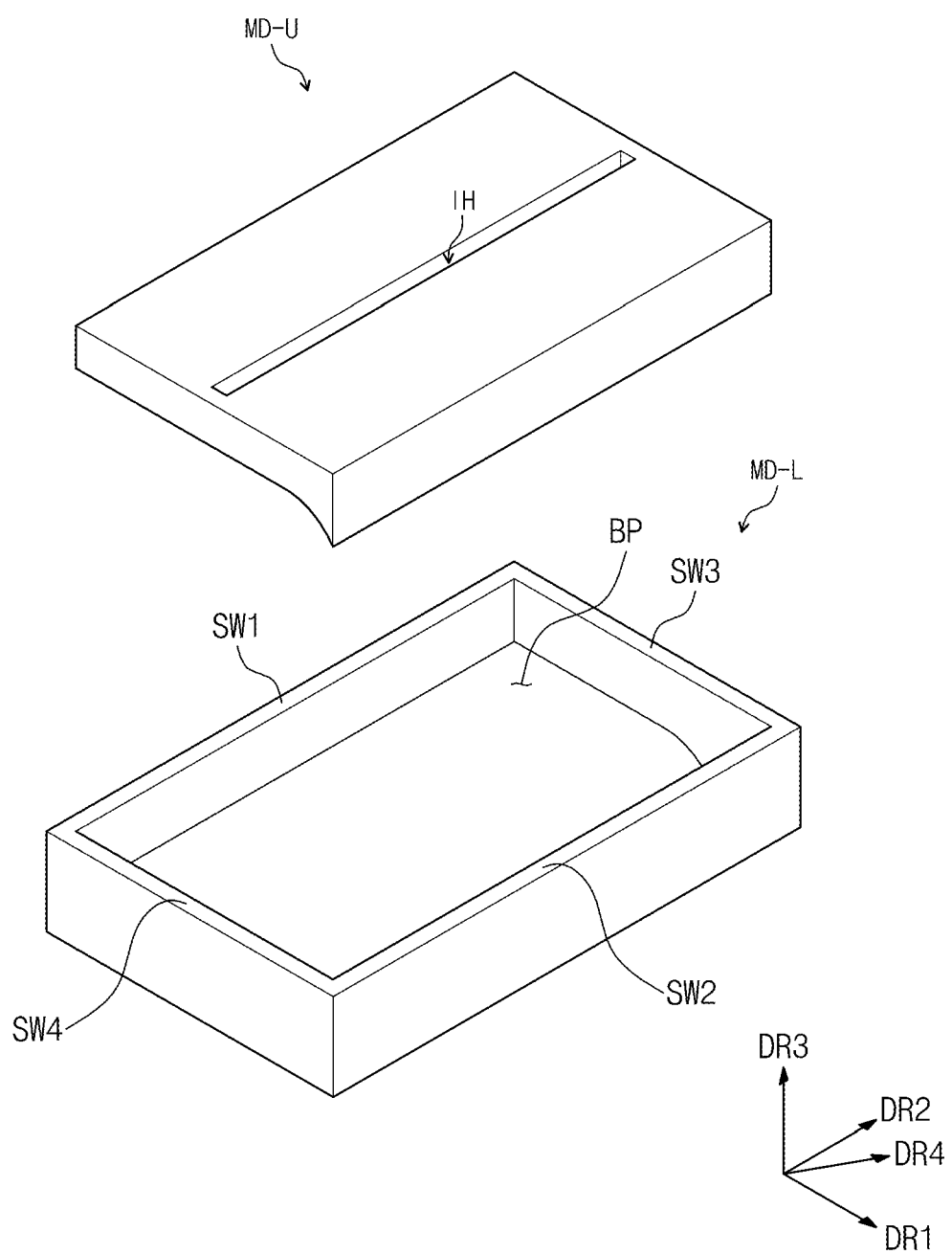
FIGS. 7A, 7B, 7C, 7D, and 7E are cross-sectional views showing a method of manufacturing a window member according to an example embodiment of the present invention.

According to the present example embodiment, the window member WM1 is manufactured by using an injection molding device shown in FIG. 7A. The injection molding device includes a lower mold MD-L and an upper mold MD-U, which can be coupled together and which are separable from each other. The lower mold MD-L includes a bottom portion BP and sidewalls SW1, SW2, SW3, and SW4 extending upward from the bottom portion BP. In the present example embodiment, the lower mold ML-L includes four sidewalls SW1, SW2, SW3, and SW4. The four sidewalls SW1, SW2, SW3, and SW4 may be omitted.

The upper mold MD-U includes an inlet IH defined along a thickness direction, e.g., a third direction DR3 shown in FIG. 7A (e.g., the inlet IH may be a hole extending through the upper mold MD-U along the third direction DR3). The upper mold MD-U may further include sidewalls. The inlet IH is defined at a center of the upper mold MD-U and has a slit shape, but it embodiments of the present invention are not be limited thereto or thereby. The inlet IH may have a circular shape when viewed in a plan view and may have a triangular shape or an isosceles trapezoid shape when viewed in a cross-section (see, e.g., FIG. 7B). Different from the position of the inlet IH shown in FIG. 7A, the inlet IH may be defined at an area disposed closer to one side portion of the upper mold MD-U in the first direction DR1 when viewed in a plan view.

Figure 7B:
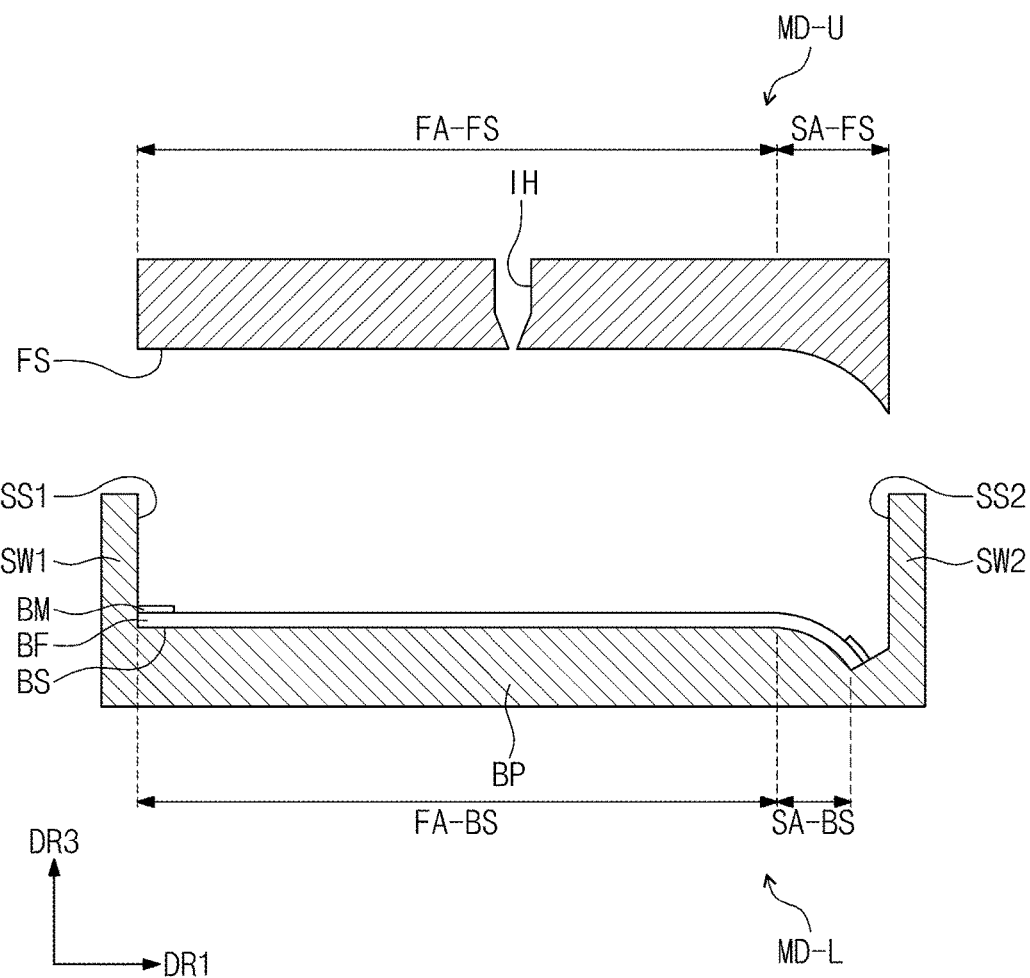

Referring to FIG. 7B, a base film BF is disposed on a bottom surface BS. The base film BF corresponds to the first resin layer PL1 shown in FIG. 4A and includes the first resin material. The base film BF is manufactured by a conventional film forming method, e.g., an extrusion molding method.

The bottom portion BP of the lower mold MD-L provides the bottom surface BS and the sidewalls SW1 and SW2 provide side surfaces SS1 and SS2. The bottom surface BS includes a flat surface area FA-BS and a side surface area SA-BS respectively corresponding to the flat surface area FA-W and the side surface area SA-W of the window member WM1.

The upper mold MD-U includes a forming surface FS facing the bottom surface BS. The forming surface FS includes a flat surface area FA-FS and a side surface area SA-FS respectively corresponding to the flat surface area FA-BS and the side surface area SA-BS of the bottom surface BS.

The bezel layer BM is formed on the front surface of the base film BF. The bezel layer BM is formed by an inkjet printing method, an imprinting method, a silk screen printing method, or a lamination method. Although not shown separately, the functional layer may be further disposed on the front surface of the base film BF. The functional layer is formed by a spin coating method, or a spray coating method.

Figure 7C:
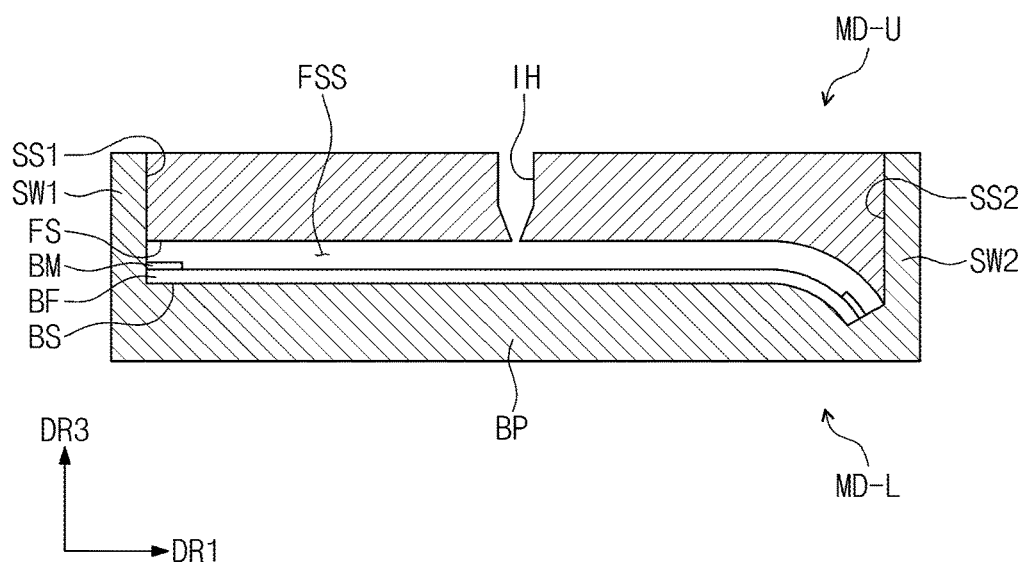

Referring to FIG. 7C, the upper mold MD-U is disposed on the lower mold MD-L to define a forming space FSS. In more detail, the upper mold MD-U is inserted into and coupled to the lower mold MD-L.

Figure 7D:
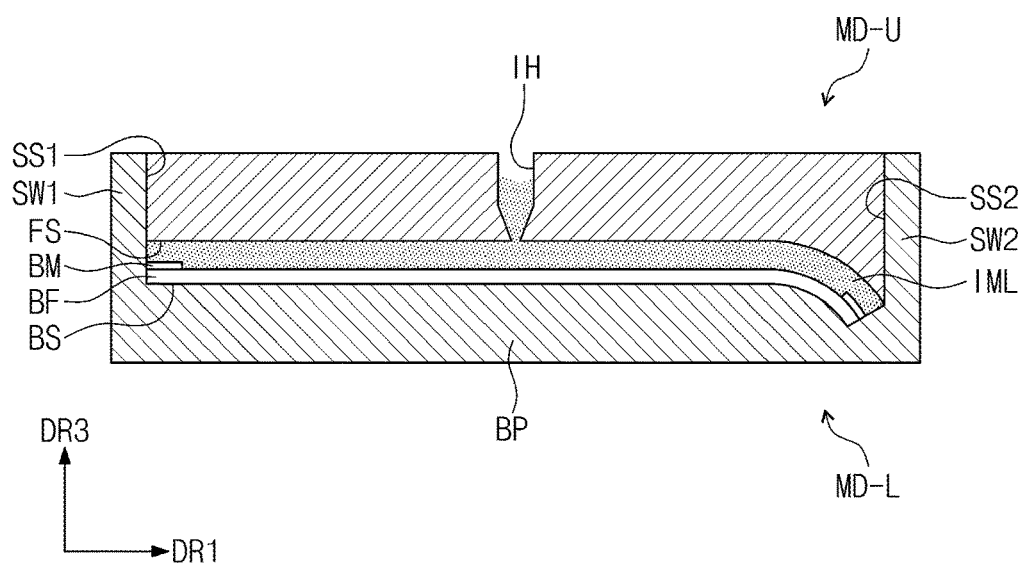

Referring to FIG. 7D, the second resin material described with reference to FIG. 4A is injected into the forming space FSS. The forming space FSS is filled with the second resin material. The second resin material is cooled to form an injection layer IL on the base film BF. The injection layer IL corresponds to the second resin layer PL2 shown in FIG. 4A.

Figure 7E:
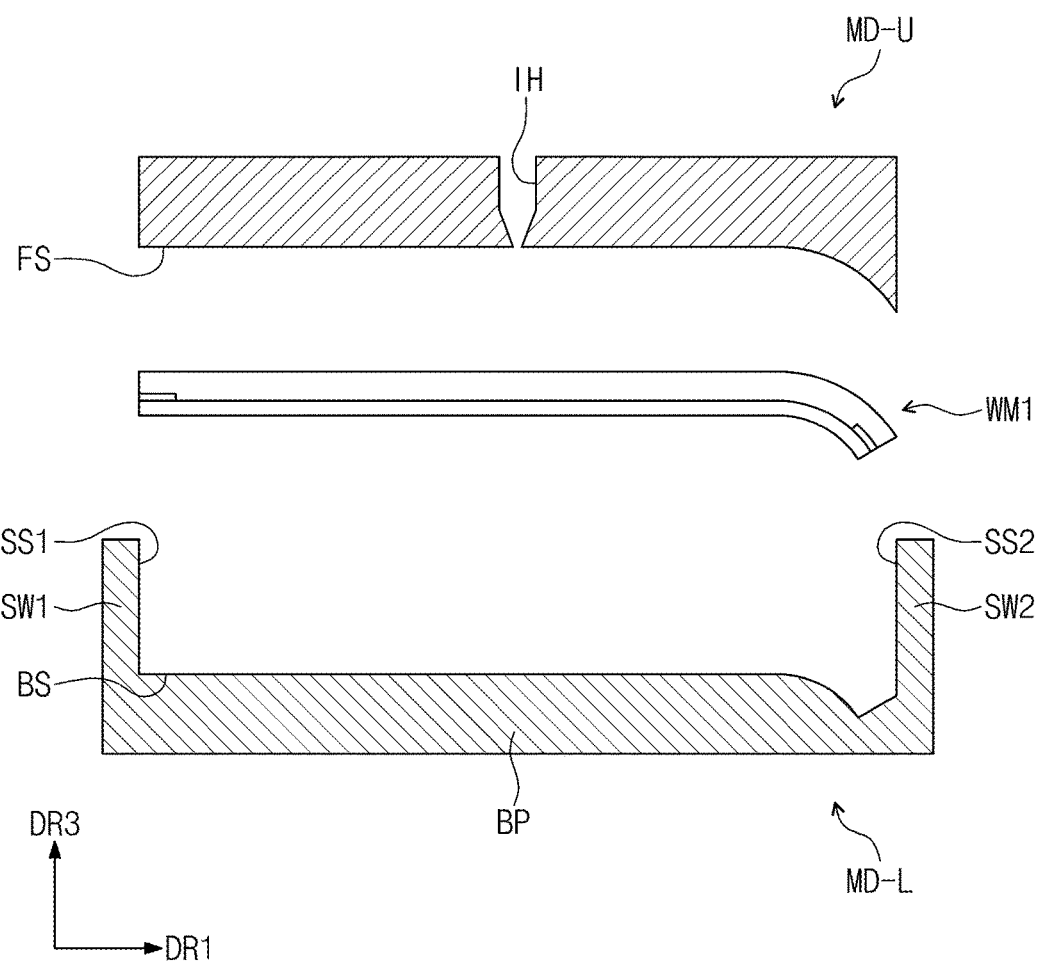

Referring to FIG. 7E, the upper mold MD-U is separated from the lower mold MD-L after the second resin material is sufficiently cured. The window member WM1 separated from the injection molding device may be polished to remove residues on edges or on the front surface.

In FIGS. 7B, 7C, 7D, and 7E, a length in the first direction DR1 of the bottom surface BS is substantially equal to a length in the first direction DR1 of the base film BF, but embodiments of the present invention are not limited thereto or thereby. For example, the length in the first direction DR1 of the bottom surface BS may be longer than the length in the first direction DR1 of the base film BF. In this case, the edges of the window member WM1 separated from the injection molding device may be polished to control the area of the window member WM1.

According to embodiments, the hard coating layer may further be formed to manufacture the window members WM2 and WM3 shown in FIGS. 5A and 5B. In this case, at least one hard coating layer is formed by a spray coating method, a dip coating method, etc. In addition, because the bezel layer BM is sealed by the base film BF and the injection layer IL, the bezel layer BM may not be damaged even though the hard coating layer is formed.

According to the manufacturing method, the three-dimensional window member having the high hardness may be manufactured. According to the manufacturing method, because the three-dimensional shape of the window member is formed without applying stress to the base member, the window member may be protected or prevented from being twisted. Further, according to the manufacturing method, a manufacturing process of the window member is simplified and a production cost of the window member is reduced.

Figure 8:
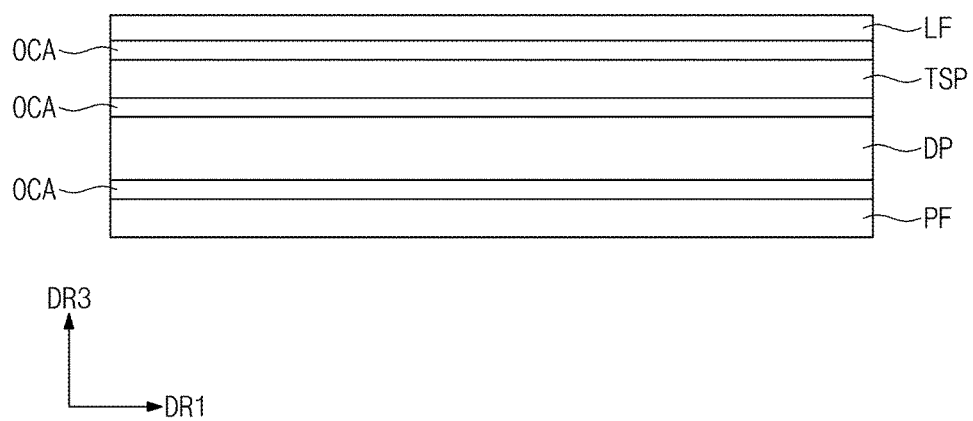
FIG. 8 is a cross-sectional view showing a display module according to an example embodiment of the present invention.

FIG. 8 is a cross-sectional view showing a display module DM according to an example embodiment of the present invention. The display module DM includes a display panel DP and functional members. The display panel DP may be a flexible display panel, e.g., an organic light emitting diode display panel, an electronic ink display panel, an electrowetting display panel, an electrophoretic display panel, etc.

The functional members may include at least one of a protective film PF, a touch screen panel TSP, and an optical member LF, but embodiments of the present invention are not limited thereto or thereby. The functional members have the flexible property. The protective film PF protects the display panel DP from external impacts. The optical member LF includes a polarizer and an optical retarder. The touch screen panel TSP may be, but is not limited to, an electrostatic capacitive type panel or an electromagnetic induction type panel.

The display panel DP, the protective film PF, the touch screen panel TSP, and the optical member LF are coupled to each other by an optical clear adhesive (OCA), but embodiments of the present invention are not limited thereto or thereby. For example, any one of the members may be directly formed on a member adjacent thereto. For instance, the polarizer may be coated on the display panel DP or the touch screen panel TSP, and electrodes and wires of the touch screen panel TSP may be integrally formed with the display panel DP.

Figure 9:
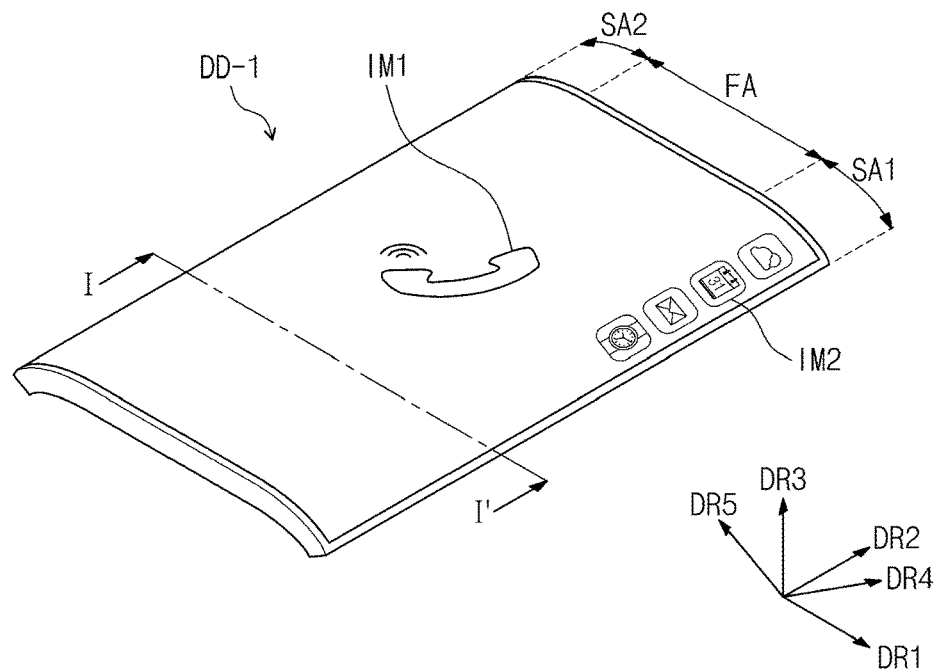
FIG. 9 is a perspective view showing a display device according to an example embodiment of the present invention.
Figure 10:
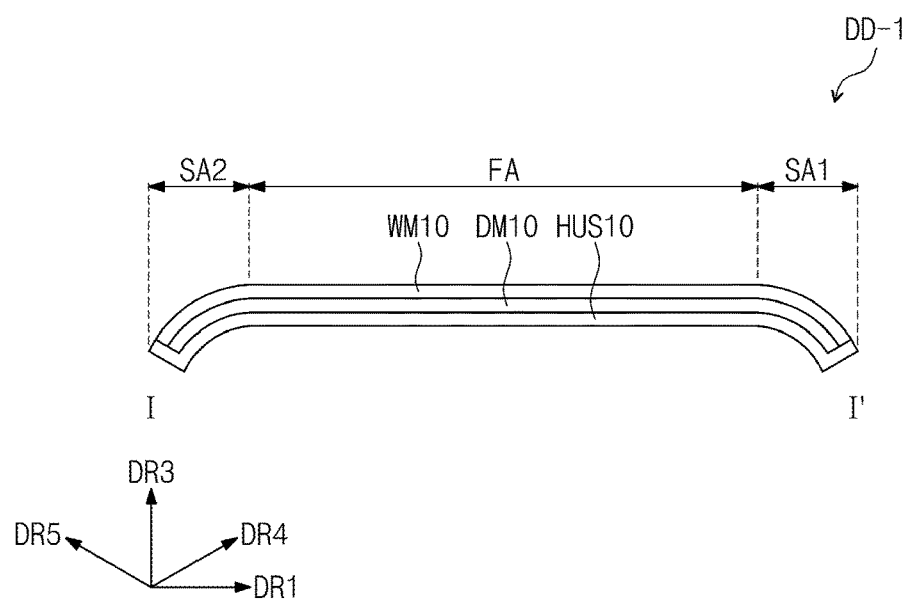
FIG. 10 is a cross-sectional view taken along a line I-I' of FIG. 9 to show a display device according to an example embodiment of the present invention.
Figure 11:
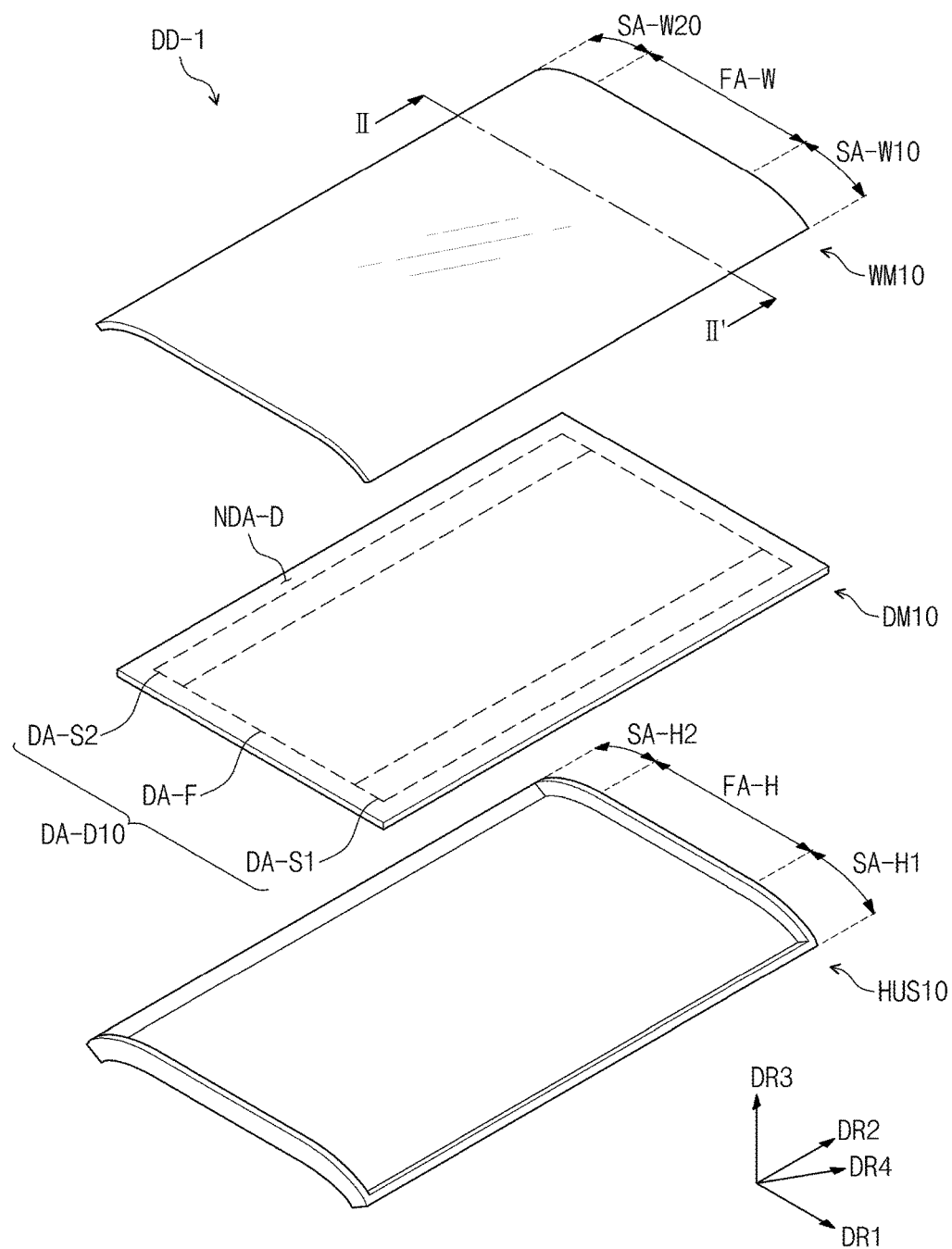
FIG. 11 is an exploded perspective view showing the display device shown in FIG. 9.

FIG. 9 is a perspective view showing a display device DD-1 according to an example embodiment of the present invention, FIG. 10 is a cross-sectional view taken along a line I-I' of FIG. 9 to show the display device DD-1 according to an example embodiment of the present invention, and FIG. 11 is an exploded perspective view showing the display device DD-1 shown in FIG. 9. In FIGS. 9, 10, and 11, the same reference numerals denote the same elements in FIGS. 1, 2, 3, 4A, 4B, 5A, 5B, 6A, 6B, 7A, 7B, 7C, 7D, 7E, and 8, and thus detailed descriptions of the same elements will be omitted. Hereinafter, the display device DD-1 will be described in more detail with reference to FIGS. 9, 10, and 11.

Referring to FIG. 9, the display device DD-1 includes a flat surface area FA (or referred to as a flat surface part) in which a main image is displayed to a front surface, a first side surface area SA1 (or referred to as a first side surface part) in which a sub-image is displayed to a side surface (e.g., a first side surface), and a second side surface area SA2 (or referred to as a second side surface part) in which the sub-image is displayed to a side surface (e.g., a second side surface). In the present example embodiment, a receiver IM1 shown on a background image is shown as the main image, and an icon IM2 shown in the backlight image is shown as the sub-image. Although not shown separately, the display device DD-1 according to the present example embodiment includes a display area in which images are displayed and a non-display area in which the images are not displayed.

Referring to FIG. 10, the display device DD-1 includes a window member WM10, a display module DM10, and a housing HUS10. The first side surface area SA1 displays the image to a fourth direction DR4 and the second side surface area SA2 displays the image to a fifth direction DR5. The fourth direction DR4 and the fifth direction DR5 are symmetrical with each other with respect to the third direction DR3.

Referring to FIG. 11, the window member WM10 includes a flat surface area FA-W (or referred to as a flat surface part), a first side surface area SA-W10 (or referred to as a first surface part), and a second side surface area SA-W20 (or referred to as a second surface part), which respectively correspond to the flat surface area FA, the first side surface area SA1, and the second side surface area SA2 of the display device DD-1.

The display module DM10 includes a display area DA-D10 and a non-display area NDA-D. The display area DA-D10 and the non-display area NDA-D define the display area and the non-display area of the display device DD-1, respectively. The display area DA-D10 includes a flat surface display area DA-F, a first side surface display area DA-S1, and a second side surface display area DA-S2, which respectively correspond to the flat surface area FA, the first side surface area SA1, and the second side surface area SA2 of the display device DD-1.

The housing HUS includes a flat surface area FA-H, a first side surface area SA-H1, and a second side surface area SA-H2, which respectively correspond to the flat surface area FA, the first side surface area SA1, and the second side surface area SA2 of the display device DD-1. In the present example embodiment, the housing HUS is integrally formed in a single unit, but the housing HUS may be configured to include plural parts coupled to each other.

Figure 12:
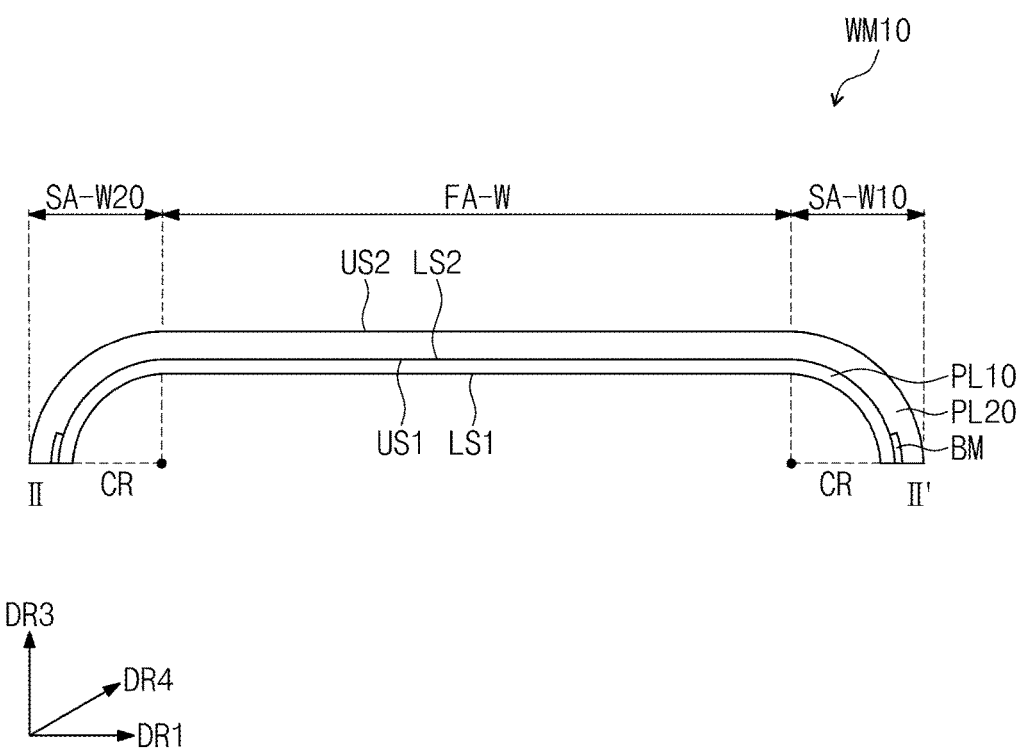
FIG. 12 is a cross-sectional view showing a window member according to an example embodiment of the present invention.
Figure 13A:
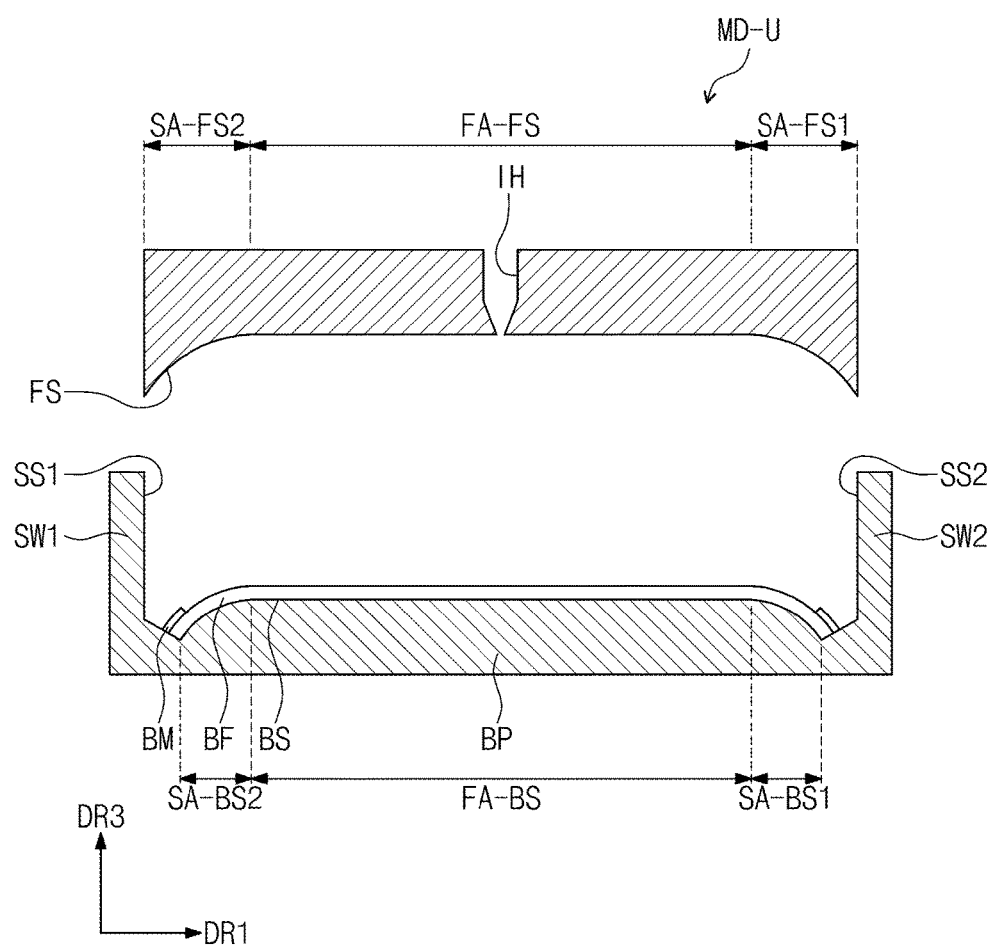
FIGS. 13A, 13B, 13C, and 13D are cross-sectional views showing a method of manufacturing a window member according to an example embodiment of the present invention.
Figure 13B:
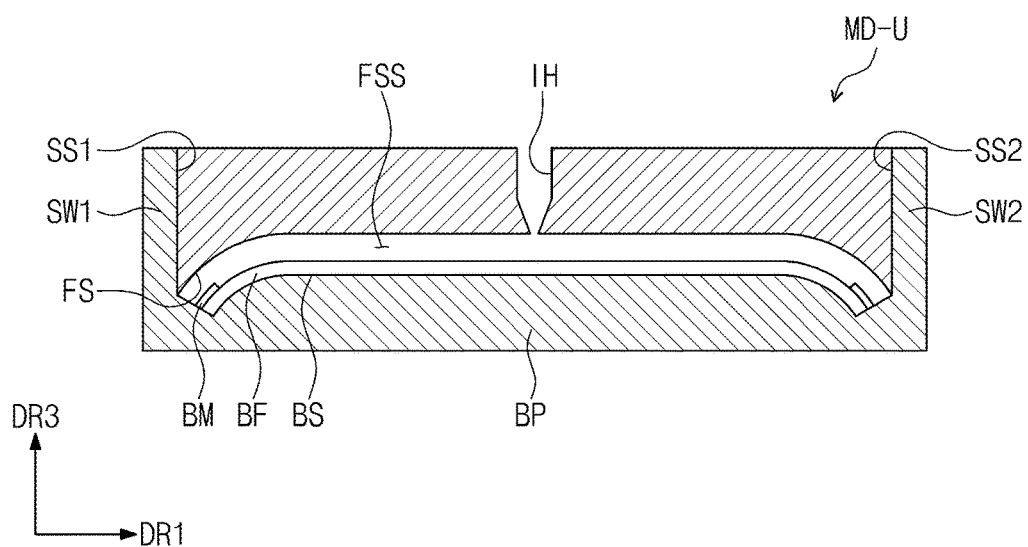
Figure 13C:
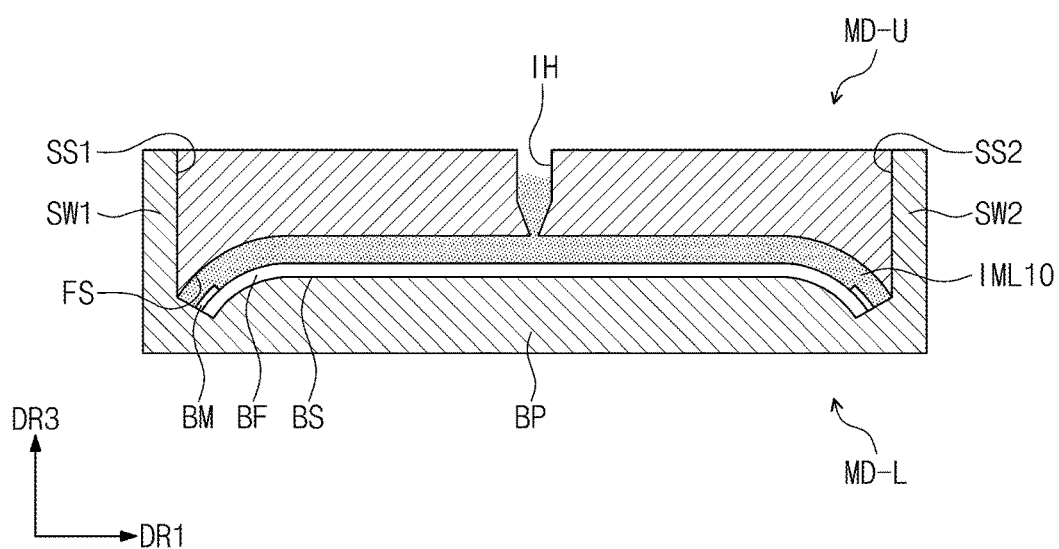
Figure 13D:
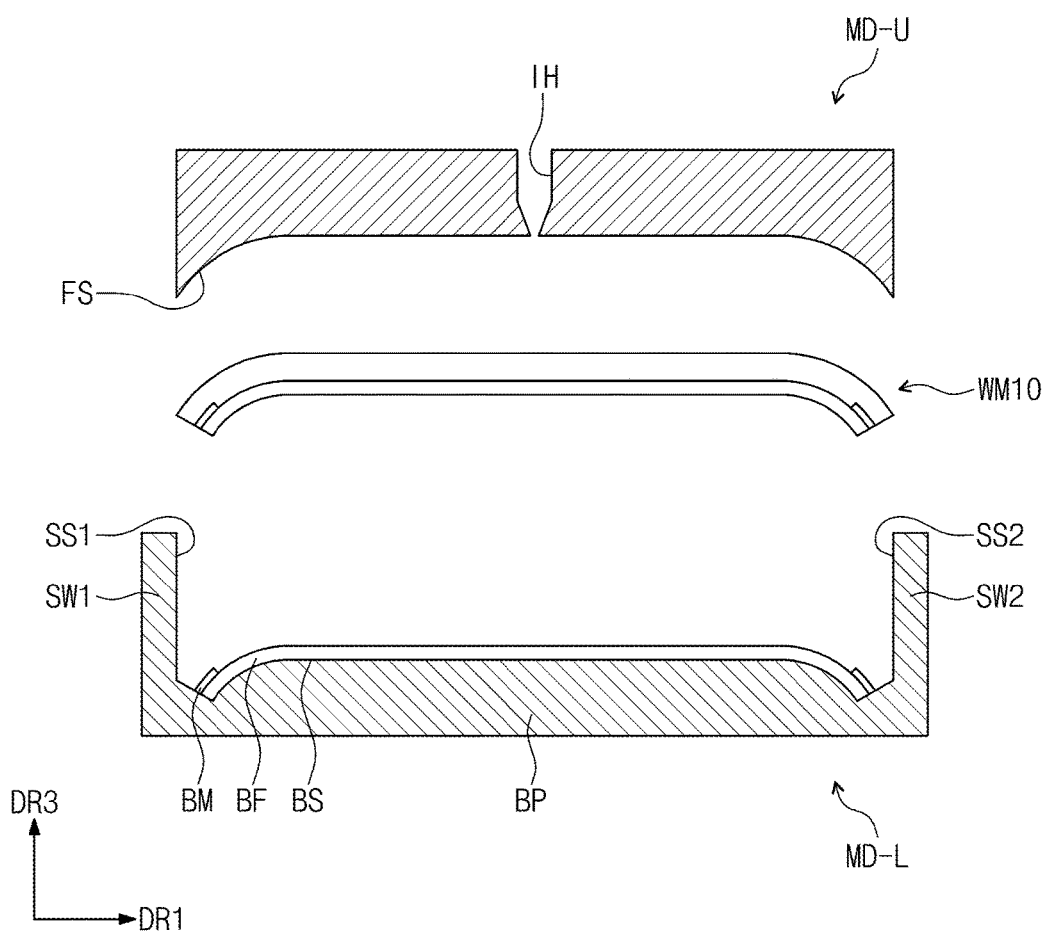

FIG. 12 is a cross-sectional view taken along a line II-II' of FIG. 11 to show the window member WM10 according to an example embodiment of the present invention and FIGS. 13A, 13B, 13C, and 13D are cross-sectional views showing a method of manufacturing the window member WM10 according to an example embodiment of the present invention.

Referring to FIG. 12, the window member WM10 includes the flat surface area FA-W, the first side surface area SA-W10 bent from one side portion of the flat surface area FA-W, and the second side surface area SA-W20 bent from the other side portion of the flat surface area FA-W. The first side surface area SA-W10 faces the second side surface area SA-W20 in the first direction DR1. The first side surface area SA-W10 and the second side surface area SA-W20 are curved at the same radius of curvature CR. According to embodiments, the first side surface area SA-W10 and the second side surface area SA-W20 may be curved at different radius of curvatures. At least one of the first side surface area SA-W10 and the second side surface area SA-W20 may be deformed as the side surface areas SA-W1 and SA-W2 shown in FIGS. 6A and 6B.

The manufacturing method of the window member WM10 shown in FIGS. 13A, 13B, 13C, and 13D corresponds to the manufacturing method of the window member WM1 shown in FIGS. 7A, 7B, 7C, 7D, and 7E. As shown in FIGS. 13A, 13B, 13C, and 13D, a bottom portion BP of a lower mold MD-L provides a bottom surface BS including two curved surfaces. The bottom surface BS includes a flat surface area FA-BS, a first side surface area SA-BS1, and a second side surface area SA-BS2, which respectively correspond to the flat surface area FA-W, the first side surface area SA-W10, and the second side surface area SA-W20 of the window member WM10. The first and second side surface areas SA-BS1 and SA-BS2 provide the curved surfaces, respectively. In the present example embodiment, the first and second side surface areas SA-BS1 and SA-BS2 may provide a support surface having a shape corresponding o the side surface areas SA-W1 and SA-W2 shown in FIGS. 6A and 6B.

Figure 14:
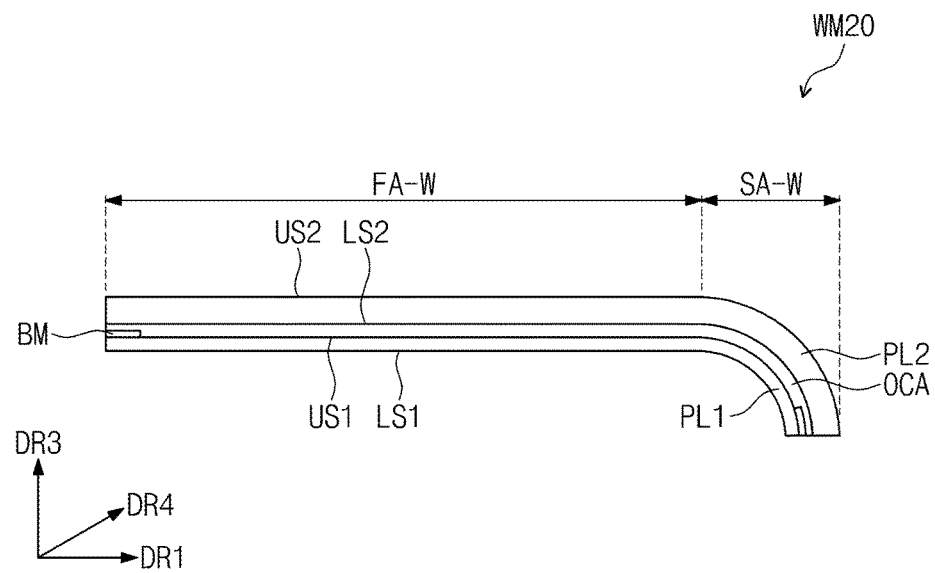
FIG. 14 is a cross-sectional view showing a window member according to an example embodiment of the present invention.

FIG. 14 is a cross-sectional view showing a window member WM20 according to an example embodiment of the present invention. In FIG. 14, the same reference numerals denote the same elements in FIGS. 1, 2, 3, 4A, 4B, 5A, 5B, 6A, 6B, 7A, 7B, 7C, 7D, 7E, 8, 9, 10, 11, 12, 13A, 13B, 13C, and 13D, and thus detailed descriptions of the same elements will be omitted. Hereinafter, the window member WM20 will be described in more detail with reference to FIG. 14.

Referring to FIG. 14, the window member WM20 includes a flat surface area FA-W and a side surface area SA-W bent from one side portion of the flat surface area FA-W. The side surface are SA-W has a shape curved at a radius of curvature (e.g., a predetermined radius of curvature). In the present example embodiment, the side surface area SA-W may be deformed as the side surface areas SA-W1 and SA-W2 shown in FIGS. 6A and 6B.

The window member WM20 includes a first resin layer PL1, a second resin layer PL2, and an optical clear adhesive layer OCA disposed between the first and second resin layers PL1 and PL2 to attach the first resin layer PL1 to the second resin layer PL2. The optical clear resin layer OCA may be, but is not limited to, a pressure-sensitive adhesive layer. The optical clear adhesive layer OCA includes at least one of an acryl-based monomer and an acrylic-based oligomer. Although not shown separately, the window member WM20 may further include the functional layer described with reference to FIGS. 5A and 5B.

Hereinafter, the window member according to the present example embodiment will be described in more detail with reference to Table 2. Comparison examples and experimental examples shown in Table 2 may further include the first hard coating layer HCL-U (refer to FIG. 5B) and the second hard coating layer HCL-L (refer to FIG. 5B) in consideration of the window member WM20 shown in FIG. 14.

First, a base film BF and a rigid member RL are provided. The base film BF is manufactured by a conventional film forming method, e.g., an injection molding method. The base film BF corresponds to the first resin layer PL1 shown in FIG. 14. A bezel layer BM is disposed on one surface of the base film BF. The bezel layer BM is formed on the one surface of the base film BF by using an inkjet printing method, an imprinting method, a silk screen printing method, or a lamination method.

TABLE 2

|  | Material/ thickness (μm)/pencil hardness of first resin layer | Thickness (μm) of optical clear adhesive layer | adhesive strength (kgf/cm2) of optical clear adhesive layer | Material/ thickness (μm)/pencil hardness of second resin layer | Thickness (μm) of first and second hard coating layer | Total thickness (μm) | Front surface pencil hardness | Impact resistance strength |
|---|---|---|---|---|---|---|---|---|
| Comparison example 1 | PC/100/B | 30 | Larger than 1 | PMMA/ 330/4H | 10 ± 4 | 480 | 7-9H | 10 |
| Comparison example 2 | PC/100/B | 30 | Larger than 1 | PMMA/ 430/4H | 10 ± 4 | 580 | 7-9H | 15 |
| Experimental example 1 | PC/150/B | 30 | Larger than 1 | PMMA/ 330/4H | 10 ± 4 | 530 | 7-9H | 20 |
| Experimental example 2 | PC/150/B | 30 | Larger than 1 | PMMA/ 430/4H | 10 ± 4 | 630 | 7-9H | 25 |
| Experimental example 3 | PC/200/B | 30 | Larger than 1 | PMMA/ 330/4H | 10 ± 4 | 580 | 7-9H | 25 |
| Experimental example 4 | PC/200/B | 30 | Larger than 1 | PMMA/ 430/4H | 10 ± 4 | 680 | 7-9H | 30 |
| Experimental example 5 | PC/150/B | 30 | Larger than 1 | PMMA/ 330/4H | 10 ± 4 | 630 | 7-9H | 30 |
| Experimental example 6 | PC/150/B | 30 | Larger than 1 | PMMA/ 430/4H | 10 ± 4 | 730 | 7-9H | 35 |

According to the comparison examples 1 and 2, because the thickness of the first resin layer is relatively thin, the impact resistance strength of the comparison examples 1 and 2 is smaller than that of the experimental examples 1, 2, 3, 4, 5, and 6. This is because the first resin layer of the comparison examples 1 and 2 is not enough to endure the tensile stress occurring when the external impact is applied to the first resin layer. Therefore, the first resin layer according to embodiments of the present invention has a thickness of about 150 micrometers or more, and the thickness of the first resin layer has a thickness less than about 250 micrometers so that the thickness of the window member is not excessively thick.

According to the present example embodiment, the second resin layer has a thickness of about 300 micrometers to about 700 micrometers. In one embodiment, the second resin layer has the thickness of about 330 micrometers to about 500 micrometers. Each of the first and second hard coating layers has a thickness of about 5 micrometers to about 35 micrometers.

The optical clear adhesive layer has a thickness of about 10 micrometers to about 100 micrometers. In more detail, the optical clear adhesive layer has a thickness of about 25 micrometers to about 50 micrometers to have an adhesive force greater than a reference force (e.g., a predetermined reference force) and a transmittance greater than a reference transmittance (e.g., fa predetermined reference transmittance), and to protect or prevent the optical clear adhesive layer from being deformed at high temperature.

Figure 15:
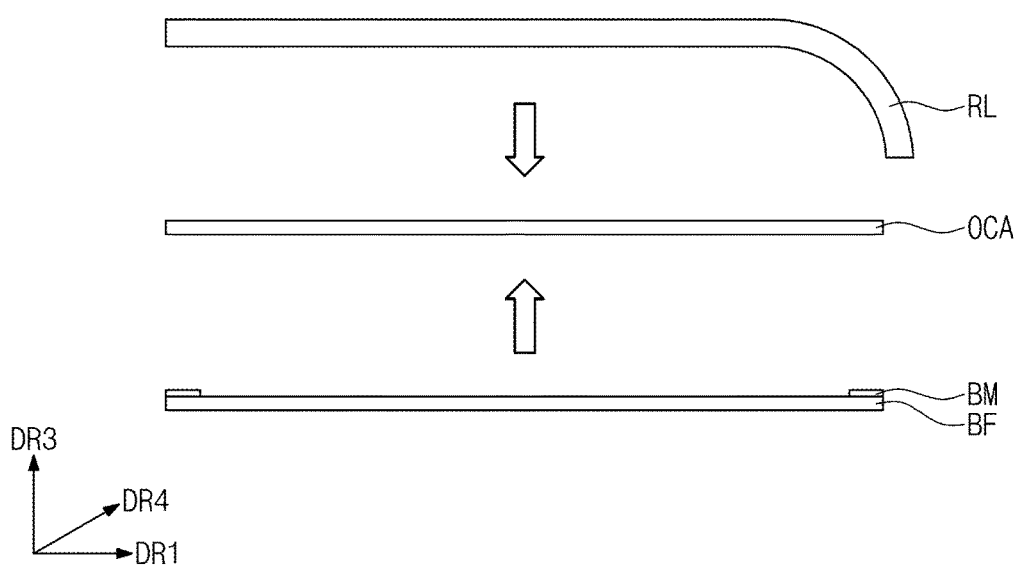
FIG. 15 is a cross-sectional view showing a method of manufacturing a window member according to an example embodiment of the present invention.

FIG. 15 is a cross-sectional view showing a method of manufacturing the window member WM20 according to an example embodiment of the present invention. Hereinafter, the manufacturing method of the window member WM20 will be described in more detail with reference to FIG. 15.

The rigid member RL is manufactured by an injection molding method, an extrusion molding method, or a press molding method. Members each having a three-dimensional shape may be manufactured by the above-mentioned molding methods at a low cost. The rigid member RL corresponds to the second resin layer PL2 shown in FIG. 14.

The optical clear adhesive member OCA is disposed between the base film BF and the rigid member RL to attach the base film BF and the rigid member RL to each other. The adhesion order of the optical clear adhesive member OCA, the base film BF, and the rigid member RL in various embodiments of the present invention is not limited to the above-mentioned adhesion order. As another way, the optical clear adhesive member OCA may be attached to the base film BF, and then the optical clear adhesive member OCA attached with the base film BF may be attached to the rigid member RL. In the present example embodiment, the optical clear adhesive member OCA and the base film BF may be sequentially attached to the rigid member RL.

The base film BF and the rigid member RL may be substantially concurrently (e.g., simultaneously) attached to the optical clear adhesive member OCA. The flexible optical clear adhesive member OCA and the flexible base film BF may be attached to the rigid member RL using a lamination apparatus.

Although not shown separately, after the optical clear adhesive member OCA, the base film BF, and the rigid member RL are coupled to each other, at least one of the first and second hard coating layers HCL-U and HCL-L (refer to FIG. 5B). The at least one hard coating layer is formed by a spray coating method or a dip coating method. Because the bezel layer BM is sealed by the base film BF and the rigid member RL, the bezel layer BM may be protected or prevented from being damaged even though the hard coating layer is formed.

According to the manufacturing method, the three-dimensional window member having the high hardness may be manufactured. According to the manufacturing method, because the three-dimensional shape of the window member is formed without applying stress to the base member, the window member may be protected or prevented from being twisted. Further, according to the manufacturing method, a manufacturing process of the window member is simplified and a production cost of the window member is reduced.

Figure 16:
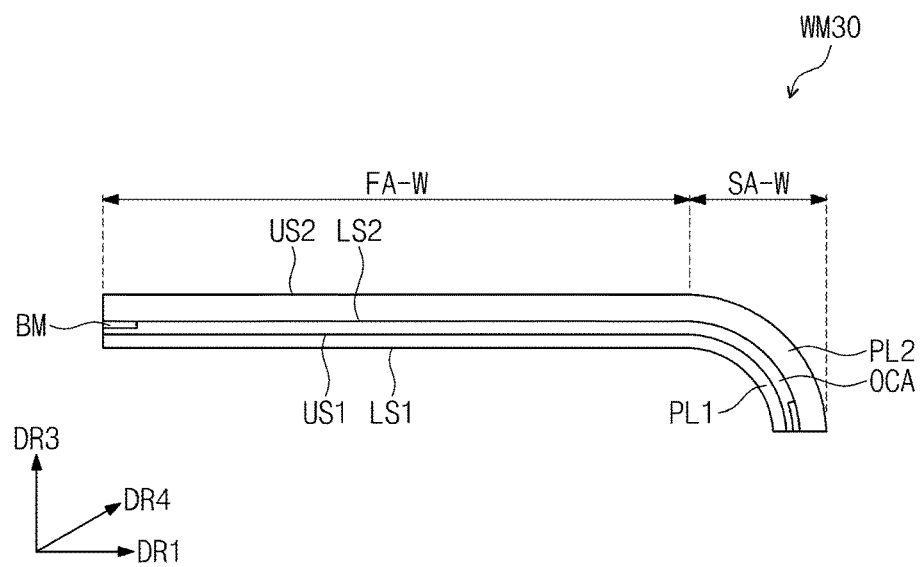
FIG. 16 is a cross-sectional view showing a window member according to an example embodiment of the present invention.
Figure 17:
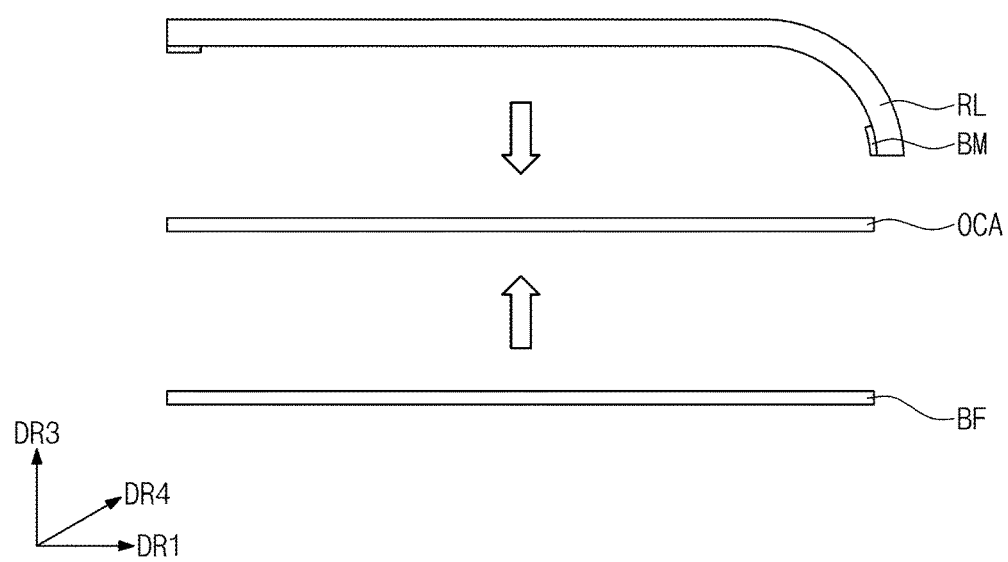
FIG. 17 is a cross-sectional view showing a method of manufacturing a window member according to an example embodiment of the present invention.

FIG. 16 is a cross-sectional view showing a window member WM30 according to an example embodiment of the present invention and FIG. 17 is a cross-sectional view showing a method of manufacturing the window member WM30 according to an example embodiment of the present invention. Hereinafter, the window member WM30 and the manufacturing method of the window member WM30 will be described in more detail with reference to FIGS. 16 and 17. In particular, different features of the window member WM30 and manufacturing method thereof from those of the window member WM20 and the manufacturing method thereof in FIGS. 14 and 15 will be mainly described with reference to FIGS. 16 and 17.

The bezel layer BM may be disposed on one surface, e.g., a rear surface, of the rigid member RL. The bezel layer BM is formed on the one surface of the rigid member RL by using an inkjet printing method, an imprinting method, a silk screen printing method, or a lamination method after the rigid member RL is formed. The manufacturing method of the window member WM30 according to the present example embodiment may be substantially the same as the manufacturing method of the window member WM20 described with reference to FIG. 15 except for the position of the bezel layer BM.

Figure 18A:
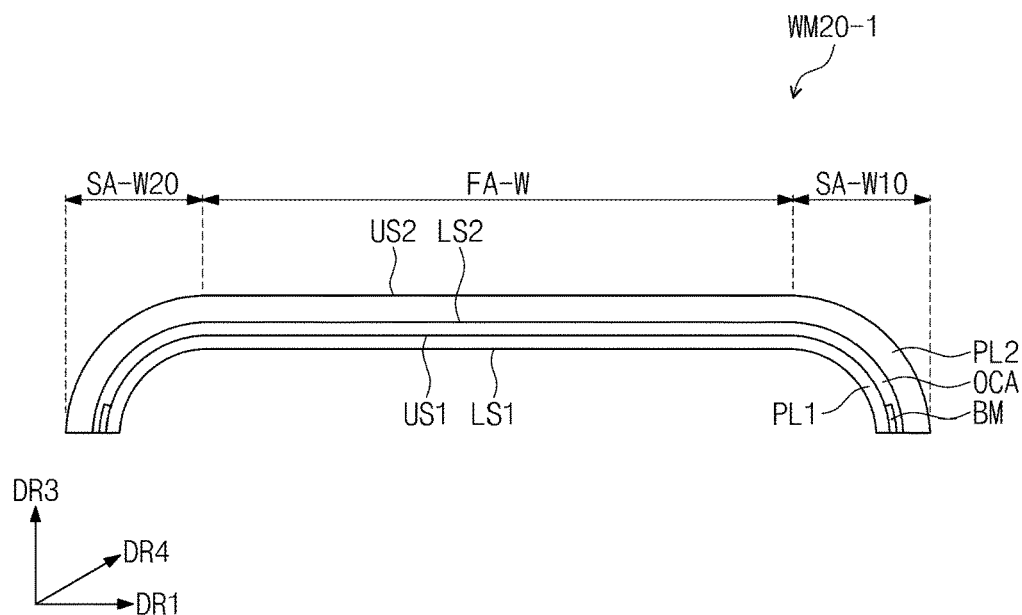
FIGS. 18A and 18B are cross-sectional views showing a window member according to an example embodiment.
Figure 18B:
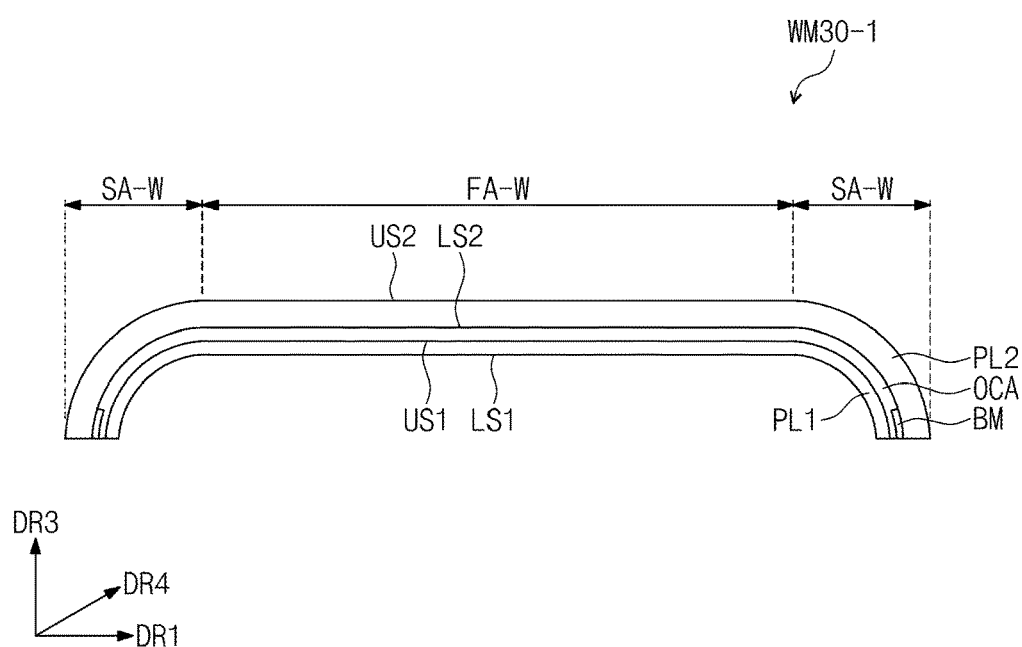

FIGS. 18A and 18B are cross-sectional views showing window members WM20-1 and WM30-1 according to an example embodiment. Hereinafter, different features of the window members WM20-1 and WM30-1 from the window members WM20 and WM30 described with reference to FIGS. 14, 15, and 16 will be mainly described.

Each of the window members WM20-1 and WM30-1 includes a flat surface area FA-W, a first side surface area SA-W10, and a second side surface area SA-W20, which respectively correspond to the flat surface area FA, the first side surface area SA1, and the second side surface area SA2 of the display device DD-1 (refer to FIG. 9). At least one of the first and second side surface areas SA-W10 and SA-W20 may be deformed as the side surface areas SA-W1 and SA-W2 shown in FIGS. 6A and 6B.

The window member WM20-1 shown in FIG. 18A may be manufactured by the same method as the manufacturing method of the window member WM20 described with reference to FIG. 15. The window member WM30-1 shown in FIG. 18B may be manufactured by the same method as the manufacturing method of the window member WM30 described with reference to FIG. 17.

Although various embodiments of the present invention have been described, it is understood that the present invention is not limited to these embodiments but various changes and modifications can be made by one ordinary skilled in the art within the spirit and scope of the present invention as hereinafter claimed.

What is claimed is:

1. A display device comprising:
a window member; and
a display module coupled to the window member, the window member comprising:
a first resin layer on the display module, the first resin layer having a first elongation applying a first strain to the first resin layer, a first thickness, and a first hardness; and
a second resin layer on the display module and the first resin layer, the second resin layer having a second elongation smaller than the first elongation, the second elongation applying a second strain to the second resin layer, the second strain being smaller than the first strain, a second thickness greater than the first thickness, and a second hardness greater than the first hardness.

2. The display device of claim 1, wherein the first thickness is in a range from about 150 micrometers to about 250 micrometers and the second thickness is in a range from about 300 micrometers to about 700 micrometers.

3. The display device of claim 2, wherein the first hardness corresponds to a hardness of a pencil hardness of about 2B to about F and the second hardness corresponds to a hardness of a pencil hardness of about 3H to about 5H.

4. The display device of claim 3, wherein the first elongation is in a range from about 20% to about 100% and the second elongation is in a range from about 1% to about 10%.

5. The display device of claim 1, wherein the first resin layer comprises polycarbonate or polyethylene terephthalate and the second resin layer comprises an acrylic-based resin.

6. The display device of claim 5, wherein the acrylic-based resin comprises polymethyl methacrylate.

7. The display device of claim 1, wherein the window member further comprises a bezel layer between the first resin layer and the second resin layer and partially overlapping with the first resin layer and the second resin layer.

8. The display device of claim 1, wherein the first resin layer comprises a first front surface and a first rear surface closer to the display module than the first front surface, the second resin layer comprises a second front surface and a second rear surface closer to the display module than the second front surface, and the window member further comprises a hard coating layer on at least one surface of the first rear surface and the second front surface.

9. The display device of claim 8, wherein the hard coating layer has a thickness of about 5 micrometers to about 35 micrometers.

10. The display device of claim 1, wherein the window member comprises a flat surface area and a first side surface area bent from a first side of the flat surface area.

11. The display device of claim 10, wherein the window member further comprises a second side surface area bent from a second side of the flat surface area, which faces the first side of the flat surface area.

12. The display device of claim 1, wherein the window member further comprises an optical clear adhesive layer between the first resin layer and the second resin layer.

13. The display device of claim 12, wherein the first resin layer comprises a first front surface and a first rear surface closer to the display module than the first front surface, the second resin layer comprises a second front surface and a second rear surface disposed closer to the display module than the second front surface, and the window member further comprises a bezel layer disposed on the first front surface and partially overlapped with the first and second resin layers.

14. The display device of claim 12, wherein the optical clear adhesive layer has a thickness of about 25 micrometers to about 50 micrometers.

15. The display device of claim 1, wherein the display module comprises a flexible display panel configured to generate an image and a touch panel coupled to the flexible display panel.

16. The display device of claim 15, wherein the flexible display panel is an organic light emitting diode display panel.

\* \* \* \* \*